(12) United States Patent
Maruyama

(10) Patent No.: US 11,437,418 B2
(45) Date of Patent: Sep. 6, 2022

(54) SOLID-STATE IMAGE PICKUP DEVICE

(71) Applicant: SONY CORPORATION, Tokyo (JP)

(72) Inventor: Shunsuke Maruyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 962 days.

(21) Appl. No.: 16/078,368

(22) PCT Filed: Feb. 14, 2017

(86) PCT No.: PCT/JP2017/005202
§ 371 (c)(1),
(2) Date: Aug. 21, 2018

(87) PCT Pub. No.: WO2017/150167
PCT Pub. Date: Sep. 8, 2017

(65) Prior Publication Data
US 2021/0217793 A1    Jul. 15, 2021

(30) Foreign Application Priority Data
Feb. 29, 2016   (JP) .............................. JP2016-036770

(51) Int. Cl.
*H01L 27/146*    (2006.01)
*H04N 5/361*    (2011.01)
*H04N 5/369*    (2011.01)

(52) U.S. Cl.
CPC .. *H01L 27/14623* (2013.01); *H01L 27/14603* (2013.01); *H01L 27/14643* (2013.01);
(Continued)

(58) Field of Classification Search
CPC ......... H01L 27/14623; H01L 27/14603; H01L 27/14643; H01L 27/14665; H04N 5/361; H04N 5/369
See application file for complete search history.

(56) References Cited

U.S. PATENT DOCUMENTS

| 4,860,076 A | * | 8/1989 | Tabei | ................ H01L 27/14665 257/55 |
| 10,283,556 B2 | * | 5/2019 | Yamazaki | ......... H01L 27/14623 |

(Continued)

FOREIGN PATENT DOCUMENTS

| JP | 2008-199101 | 8/2008 |
| JP | 2009-049525 | 3/2009 |

(Continued)

OTHER PUBLICATIONS

Extended European Search Report for European Patent Application No. 17759638.4, dated Apr. 8, 2019, 10 pages.

(Continued)

*Primary Examiner* — Albert H Cutler
(74) *Attorney, Agent, or Firm* — Sheridan Ross P.C.

(57) ABSTRACT

The present technology relates to a solid-state image pickup device that can suppress dark current thereby to suppress picture quality degradation. A solid-state image pickup device includes a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns. The pixel array region has a voltage application pixel on an outermost circumference of the pixel array region or on the outer side with respect to an effective pixel region of the pixel array region, the voltage application pixel being one of the pixels to which a fixed voltage is normally applied. The present technology can be applied, for example, to a solid-state image pickup device and so forth.

20 Claims, 18 Drawing Sheets

(52) U.S. Cl.
CPC ....... *H01L 27/14665* (2013.01); *H04N 5/361* (2013.01); *H04N 5/369* (2013.01)

(56) References Cited

U.S. PATENT DOCUMENTS

| | | | |
|---|---|---|---|
| 2007/0041062 A1 | 2/2007 | Chinnaveerappan et al. | |
| 2008/0211954 A1* | 9/2008 | Ota | H01L 27/1462 348/311 |
| 2009/0046185 A1 | 2/2009 | Ota | |
| 2009/0086069 A1* | 4/2009 | Gomi | H04N 9/04557 348/294 |
| 2011/0032391 A1* | 2/2011 | Cheung | H04N 5/361 348/241 |
| 2011/0285883 A1* | 11/2011 | Goto | H04N 5/355 348/294 |
| 2012/0081588 A1* | 4/2012 | Adkisson | H04N 5/3595 348/308 |
| 2012/0286328 A1 | 11/2012 | Nishida et al. | |
| 2013/0193339 A1* | 8/2013 | Oda | H04N 5/32 250/394 |
| 2013/0277536 A1 | 10/2013 | Mizuno et al. | |
| 2013/0327950 A1* | 12/2013 | Niwa | H04N 5/3745 250/395 |
| 2014/0264693 A1* | 9/2014 | Oganesian | H01L 27/14632 257/432 |
| 2015/0077611 A1* | 3/2015 | Yamashita | H04N 5/3559 348/308 |
| 2015/0256776 A1* | 9/2015 | Okada | H04N 5/361 348/243 |
| 2015/0319384 A1 | 11/2015 | Onishi | |
| 2016/0035768 A1* | 2/2016 | Kawahara | H01L 27/14685 250/208.1 |

FOREIGN PATENT DOCUMENTS

| | | | |
|---|---|---|---|
| JP | 200949525 | * | 3/2009 |
| JP | 2014-072237 | | 4/2014 |
| JP | 2015-213209 | | 11/2015 |
| WO | WO 2008/108926 | | 9/2008 |
| WO | WO 2008/108935 | | 9/2008 |
| WO | WO 2011/089949 | | 5/2013 |
| WO | WO2011089949 | * | 5/2013 |

OTHER PUBLICATIONS

International Search Report prepared by the Japan Patent Office dated Apr. 19, 2017, for International Application No. PCT/JP2017/005202.

Official Action (no English translation available) for Japan Patent Application No. 2018-503012, dated Feb. 24, 2021, 5 pages.

* cited by examiner

SOLID-STATE IMAGE PICKUP DEVICE

CROSS REFERENCE TO RELATED APPLICATIONS

This application is a national stage application under 35 U.S.C. 371 and claims the benefit of PCT Application No. PCT/JP2017/005202 having an international filing date of 14 Feb. 2017, which designated the United States, which PCT application claimed the benefit of Japanese Patent Application No. 2016-036770 filed 29 Feb. 2016, the entire disclosures of each of which are incorporated herein by reference.

TECHNICAL FIELD

The present technology relates to a solid-state image pickup device, and particularly to a solid-state image pickup device that suppresses dark current such that image quality degradation can be suppressed.

BACKGROUND ART

A solid-state image pickup device in which a chemical semiconductor such as InGaAs is used as a photoelectric conversion unit adopts a structure in which a first substrate that forms the photoelectric conversion unit and a second substrate that forms a reading out circuit for reading out accumulated charge are joined together by bumps or electrodes (for example, refer to PTL 1).

CITATION LIST

Patent Literature

[PTL 1]
PCT Patent Publication No. WO2011/089949

SUMMARY

Technical Problem

Incidentally, in pixels on an outermost circumference of a pixel array region, dark current is liable to deteriorate by an influence of a processed portion interface of a chemical semiconductor that forms a photoelectric conversion unit. Especially, in a circuit in which a reading out circuit is of the source follower type, as charge is accumulated, the potential difference of the pixels decreases, and a dark current component successively influences on adjacent pixels by blooming. In order to avoid the influence, many ineffective pixels are required, and this causes increase of the chip area or increase of the cost.

Also in pixels on the boundary between an effective pixel region and an OPB (Optical Black) region for detecting the black level, when light of a high illuminance is irradiated, there is the possibility that blooming from effective pixels may have an influence on the OPB pixels similarly as in the case of the pixels on the outermost circumference. In order to avoid the influence, many ineffective pixels are still required, and this makes a cause of an increase of the chip area or an increase of the cost.

The present technology has been made in view of such a situation as described above and makes it possible to suppress dark current thereby to suppress picture quality degradation.

Solution to Problem

A solid-state image pickup device according to a first aspect of the present technology includes a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, in which the pixel array region has a voltage application pixel on an outermost circumference of the pixel array region or on the outer side with respect to an effective pixel region of the pixel array region, the voltage application pixel being one of the pixels to which a fixed voltage is normally applied.

In the first aspect of the present technology, a pixel array region is provided in which pixels each including a photoelectric conversion unit having one of a chemical semiconductor, amorphous silicon, germanium, a quantum dot photoelectric conversion film and an organic photoelectric conversion film are disposed two-dimensionally in rows and columns, and a voltage application pixel is provided on an outermost circumference of the pixel array region or on the outer side with respect to an effective pixel region of the pixel array region, the voltage application pixel being one of the pixels to which a fixed voltage is normally applied.

A solid-state image pickup device according to a second aspect of the present technology includes a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, in which the pixel array region has a voltage application pixel between an effective pixel and an OPB pixel of the pixel array region, the voltage application pixel being one of the pixels to which a fixed voltage is normally applied.

In the second aspect of the present technology, a pixel array region is provided in which pixels each including a photoelectric conversion unit having one of a chemical semiconductor, amorphous silicon, germanium, a quantum dot photoelectric conversion film and an organic photoelectric conversion film are disposed two-dimensionally in rows and columns. A voltage application pixel is provided between an effective pixel and an OPB pixel of the pixel array region, the voltage application pixel being one of the pixels to which a fixed voltage is normally applied.

A solid-state image pickup device according to a third aspect of the present technology includes a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, in which a PN junction portion is not disposed on a processed portion end face of the photoelectric conversion unit, which is an outermost circumference of the pixel array region.

In the third aspect of the present technology, a pixel array region is provided in which pixels each including a photoelectric conversion unit having one of a chemical semiconductor, amorphous silicon, germanium, a quantum dot photoelectric conversion film and an organic photoelectric conversion film are disposed two-dimensionally in rows and columns. A PN junction portion is not disposed on a processed portion end face of the photoelectric conversion unit, which is an outermost circumference of the pixel array region.

A solid-state image pickup device according to a fourth aspect of the present technology includes a protective film configured to cover a processed portion end face of a photoelectric conversion unit, which is an outermost circumference of a pixel array region in which pixels are disposed two-dimensionally in rows and columns, each of the pixels including the photoelectric conversion unit that has one of a chemical semiconductor, amorphous silicon, germanium, a quantum dot photoelectric conversion film and an organic photoelectric conversion film.

In the fourth aspect of the present technology, a protective film is provided which is configured to cover a processed portion end face of a photoelectric conversion unit, which is an outermost circumference of a pixel array region in which pixels are disposed two-dimensionally in rows and columns, each of the pixels including the photoelectric conversion unit that has one of a chemical semiconductor, amorphous silicon, germanium, a quantum dot photoelectric conversion film and an organic photoelectric conversion film.

A solid-state image pickup device according to a fifth aspect of the present technology includes an insulating film and a metal film that provide a MIS structure to a processed portion end face of a photoelectric conversion unit, which is an outermost circumference of a pixel array region in which pixels are disposed two-dimensionally in rows and columns, each of the pixels including the photoelectric conversion unit that has one of a chemical semiconductor, amorphous silicon, germanium, a quantum dot photoelectric conversion film and an organic photoelectric conversion film.

In the fifth aspect of the present technology, an insulating film and a metal film are provided which provide a MIS structure to a processed portion end face of a photoelectric conversion unit, which is an outermost circumference of a pixel array region in which pixels are disposed two-dimensionally in rows and columns, each of the pixels including the photoelectric conversion unit that has one of a chemical semiconductor, amorphous silicon, germanium, a quantum dot photoelectric conversion film and an organic photoelectric conversion film.

A solid-state image pickup device according to a sixth aspect of the present technology includes a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, and a voltage controlling unit configured to vary a voltage to be applied to the photoelectric conversion unit of the pixels in response to a surrounding environment.

In the sixth aspect of the present technology, a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, and a voltage controlling unit configured to vary a voltage to be applied to the photoelectric conversion unit of the pixels in response to a surrounding environment, are provided.

A solid-state image pickup device according to a seventh aspect of the present technology includes a pixel array region in which pixels are disposed two-dimensionally in rows and columns, each of the pixels including a photoelectric conversion unit having one of a chemical semiconductor, amorphous silicon, germanium, a quantum dot photoelectric conversion film and an organic photoelectric conversion film, a plurality of capacitive elements each of which accumulates charge generated by the photoelectric conversion unit, and a changeover controlling unit that changes over a parallel connection of the plurality of capacitive elements between on and off in response to a surrounding environment.

In the seventh aspect of the present technology, a pixel array region is provided in which pixels are disposed two-dimensionally in rows and columns. In each of the pixels, a photoelectric conversion unit having one of a chemical semiconductor, amorphous silicon, germanium, a quantum dot photoelectric conversion film and an organic photoelectric conversion film, a plurality of capacitive elements each of which accumulates charge generated by the photoelectric conversion unit, and a changeover controlling unit that changes over a parallel connection of the plurality of capacitive elements between on and off in response to a surrounding environment, are provided.

The solid-state image pickup device may be an independent device or a module incorporated in a different apparatus Advantageous Effect of Invention With the first to seventh aspects of the present technology, dark current can be suppressed to suppress picture quality degradation.

It is to be noted that the effect described here is not necessarily restrictive and may be any one of the effects described in the present disclosure.

DESCRIPTION OF EMBODIMENTS

In the following, modes for carrying out the present technology (hereinafter referred to as embodiments) are described. It is to be noted that the description is given in the following order.
1. Example of General Configuration of Solid-State Image Pickup Device
2. Pixel Circuit
3. First Embodiment (example of configuration in which reset Tr on outermost circumference is normally kept on)
4. Second Embodiment (example of configuration in which reading out circuit on outermost circumference is short-circuited)
5. Third Embodiment (example of configuration in which reset Tr of OPB pixel is normally kept on)
6. Fourth Embodiment (example of configuration in which reading out circuit for OPB pixel is short-circuited)
7. Process of Photoelectric Conversion Unit Processed End (first to third processed portion end face structures)
8. Summary of First to Fourth Embodiments
9. Fifth Embodiment (pixel structure that implements high dynamic range)
10. Application Example to Endoscope Surgery System
11. Application Example to Mobile Body

1. Example of General Configuration of Solid-State Image Pickup Device

Figure 1:
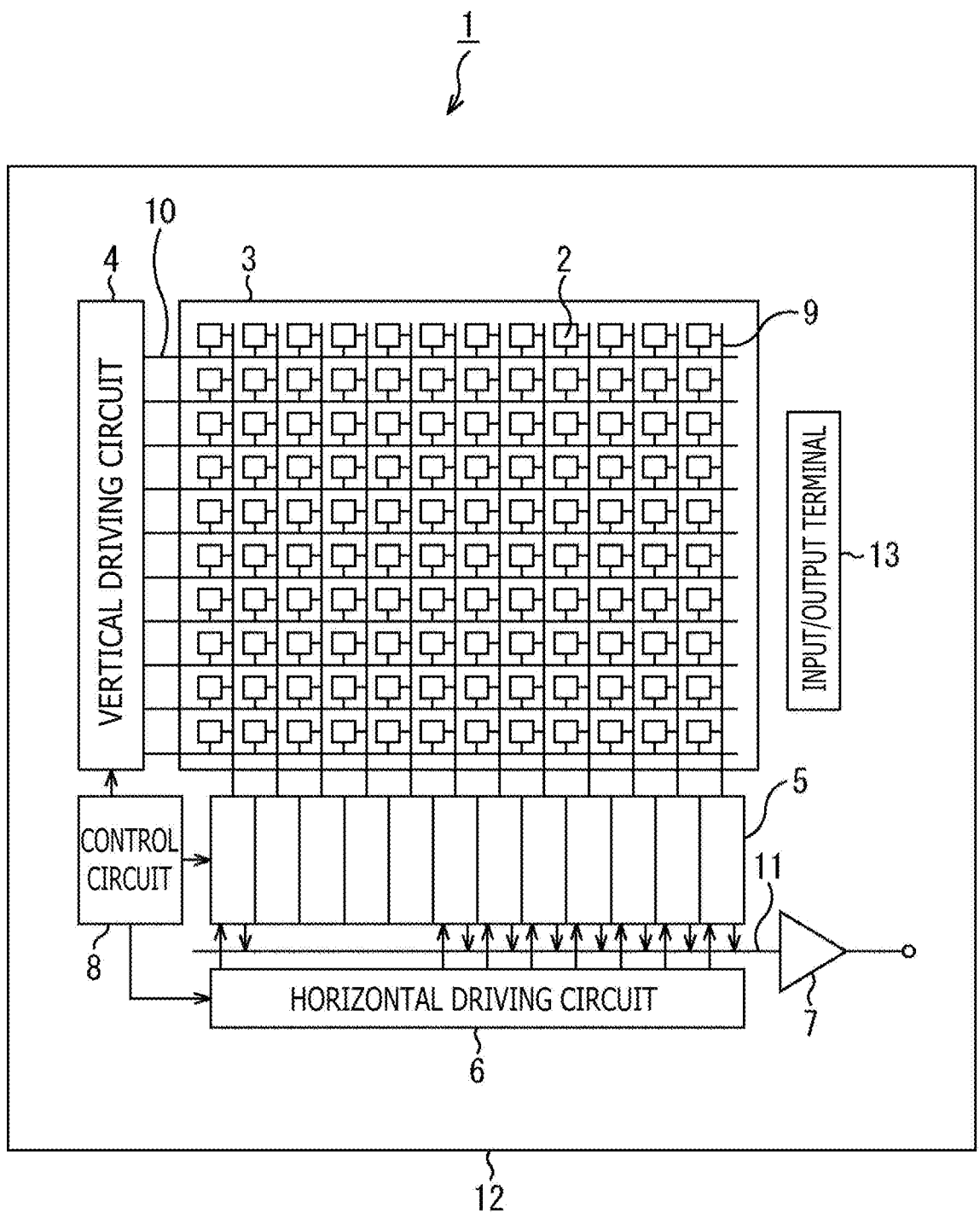
FIG. 1 is a view depicting a schematic configuration of a solid-state image pickup device to which the present technology is applied.

FIG. 1 depicts a schematic configuration of a solid-state image pickup device to which the present technology is applied.

The solid-state image pickup device 1 of FIG. 1 is configured such that it includes a pixel array region 3 in which pixels 2 are disposed two-dimensionally in rows and columns on a semiconductor substrate 12 for which, for example, single crystal silicon (Si) is used as a semiconductor, and a peripheral circuit region 71 (FIG. 4) around the pixel array region 3. In the peripheral circuit region 71, a vertical driving circuit 4, a column signal processing circuit 5, a horizontal driving circuit 6, an outputting circuit 7, a control circuit 8 and so forth are included.

Each pixel 2 is formed such that it includes a photoelectric conversion unit configured from a semiconductor thin film or the like and a plurality of pixel transistors. The plurality of pixel transistors are configured, for example, from three MOS transistors of a reset transistor, an amplification transistor and a selection transistor.

The control circuit 8 receives an input clock and data for instruction of an operation mode and so forth and outputs data of internal information and so forth of the solid-state image pickup device 1. In particular, the control circuit 8 generates a clock signal, which serves as a reference for operation of the column signal processing circuit 5, horizontal driving circuit 6 and so forth, and a control signal on the basis of a vertical synchronizing signal, a horizontal synchronizing signal and a master clock. Further, the control circuit 8 outputs the generated clock signal and control signal to the vertical driving circuit 4, column signal processing circuit 5, horizontal driving circuit 6 and so forth.

The vertical driving circuit 4 is configured, for example, from a shift register, and selects a predetermined pixel driving wiring line 10, supplies a pulse for driving the pixels 2 to the selected pixel driving wiring line 10 and drives the pixels 2 in a unit of a row. In particular, the vertical driving circuit 4 selectively scans the pixels 2 of the pixel array region 3 successively in the vertical direction in a unit of a row such that it causes the photoelectric conversion unit of each pixel 2 to supply a pixel signal based on signal charge generated therein in response to a reception light amount to the column signal processing circuit 5 through a vertical signal line 9.

The column signal processing circuit 5 is disposed for each row of the pixels 2 and performs signal processing such as noise removal for signals outputted from the pixels 2 for one column for each row. For example, the column signal processing circuits 5 perform signal processing such as CDS (Correlated Double Sampling) for removing fixed pattern noise unique to each pixel, AD conversion and so forth.

The horizontal driving circuit 6 is configured, for example, from a shift register, and successively outputs a horizontal scanning pulse to successively select the column signal processing circuits 5 such that a pixel signal is outputted from each of the column signal processing circuits 5 to horizontal signal lines 11.

The outputting circuit 7 performs signal processing for a signal successively supplied from each of the column signal processing circuits 5 through the horizontal signal lines 11 and outputs a resulting signal. The outputting circuit 7 sometimes performs only buffering or sometimes performs black level adjustment, column dispersion correction, various digital signal processes and so forth. Input/output terminals 13 perform exchange of a signal to and from the outside.

The solid-state image pickup device 1 configured in such a manner as described above is a CMOS image sensor of the type called column AD type in which the column signal processing circuits 5 that perform a CDS process and an AD conversion process are disposed for individual columns.

2. Pixel Circuit

Figure 2:
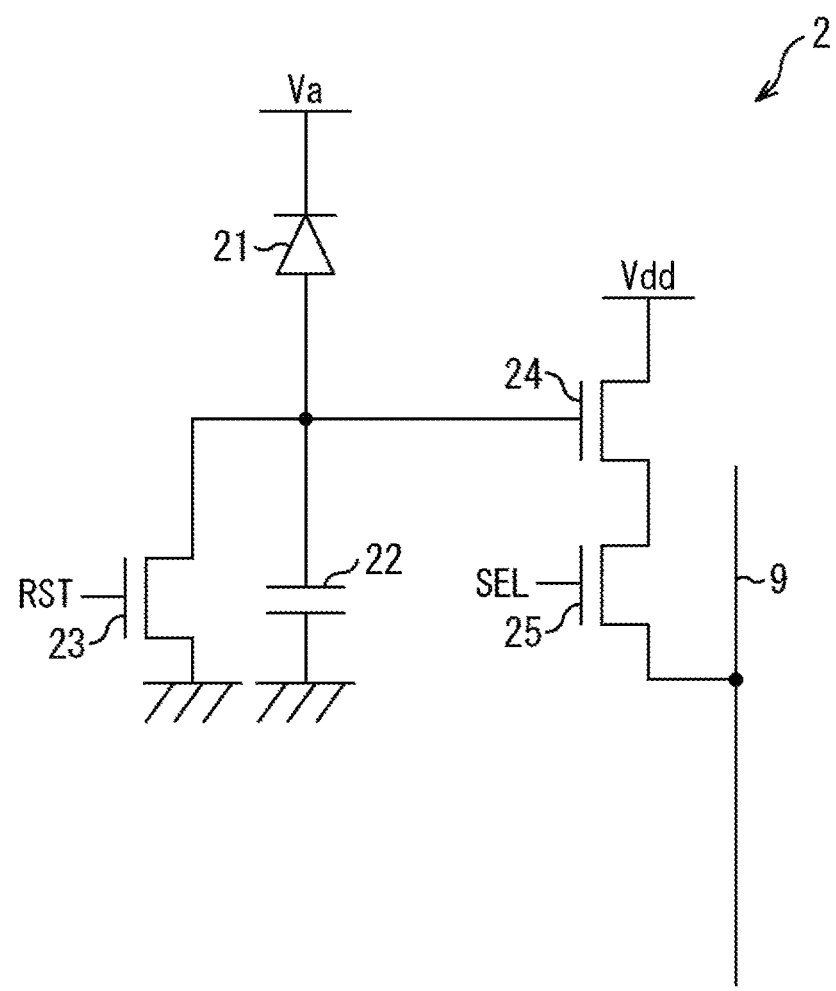
FIG. 2 is a view depicting a pixel circuit of each pixel of the solid-state image pickup device.

FIG. 2 depicts a pixel circuit of each pixel 2 of the solid-state image pickup device 1.

The pixel 2 includes a photoelectric conversion unit 21, a capacitive element 22, a reset transistor 23, an amplification transistor 24 and a selection transistor 25.

The photoelectric conversion unit 21 is configured from a semiconductor thin film using a chemical semiconductor such as InGaAs and generates charge (signal charge) according to the received light amount. The photoelectric conversion unit 21 has a predetermined bias voltage Va applied thereto.

The capacitive element 22 accumulates charge generated by the photoelectric conversion unit 21. The capacitive element 22 can be configured including at least one of, for example, a PN junction capacitor, a MOS capacitor or a wiring line capacitor.

The reset transistor 23 resets the potential of the capacitive element 22 by discharging charge accumulated in the capacitive element 22 to the source (ground) when it is turned on by a reset signal RST.

The amplification transistor 24 outputs a pixel signal according to an accumulation potential of the capacitive element 22. In particular, the amplification transistor 24 cooperates with a load MOS (not depicted) as a fixed current source connected thereto through the vertical signal line 9 to configure a source follower circuit, and a pixel signal indicative of a level according to the charge accumulated in the capacitive element 22 is outputted from the amplification transistor 24 to the column signal processing circuits 5 through the selection transistor 25.

The selection transistor 25 is turned on when the pixel 2 is selected by a selection signal SEL and outputs a pixel signal of the pixel 2 to the column signal processing circuit 5 through the vertical signal line 9. Each of the signal lines along which a transfer signal TRX, a selection signal SEL and a reset signal RST are transmitted corresponds to the pixel driving wiring line 10 of FIG. 1.

3. First Embodiment

Now, a pixel structure of a first embodiment of the solid-state image pickup device 1 is described.

Figure 3:
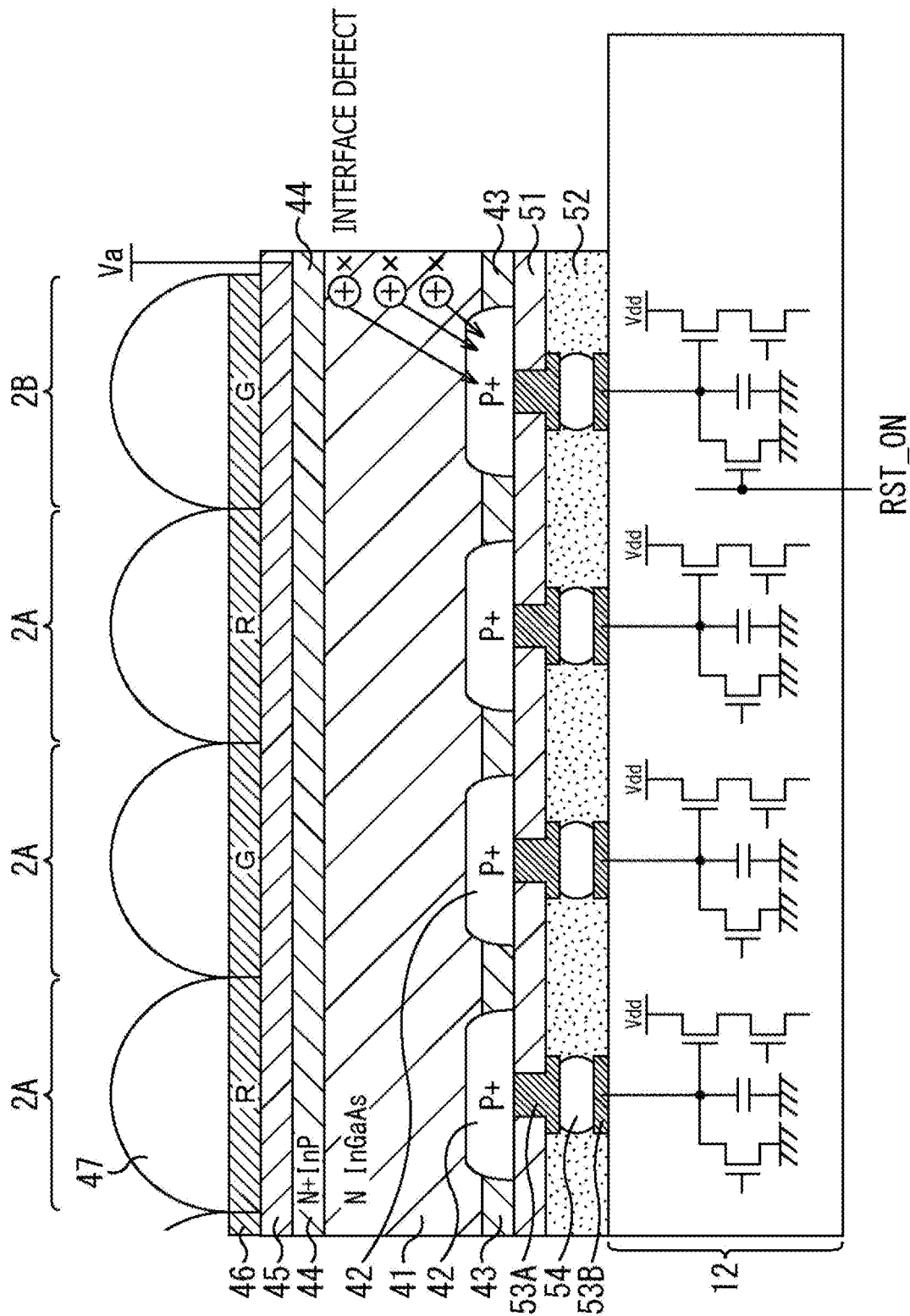
FIG. 3 is a cross sectional view depicting a pixel structure of a first embodiment.

FIG. 3 is a cross sectional view depicting a pixel structure of the first embodiment.

Although details are hereinafter described, in FIG. 3, pixels 2 in the pixel array region 3 are classified into ordinary pixels 2A and charge emitting pixels 2B depending upon a difference in control of the reset transistor 23. However, since pixel structures of the ordinary pixels 2A and the charge emitting pixels 2B are same as each other, in the following description, both the ordinary pixels 2A and the charge emitting pixels 2B are referred to merely as pixel 2. It is to be noted that the charge emitting pixels 2B are disposed on the most outer side of the pixel array region 3.

A reading out circuit of the capacitive element 22, reset transistor 23, amplification transistor 24 and selection transistor 25 of each pixel 2 described hereinabove with reference to FIG. 2 is formed for each pixel on the semiconductor substrate 12 that includes of a single crystal material such as, for example, single crystal silicon (Si). It is to be noted that, in sectional views following FIG. 3, the reference numerals for the capacitive element 22, reset transistor 23, amplification transistor 24 and selection transistor 25 formed on the semiconductor substrate 12 are omitted.

On an upper side that is a light incidence side of the semiconductor substrate 12, an N-type semiconductor thin film 41 that forms the photoelectric conversion unit 21 is formed on an overall area of the pixel array region 3. For the N-type semiconductor thin film 41, InGaP, InAlP, InGaAs, InAlAs and a chemical semiconductor of the chalcopyrite structure are used. A chemical semiconductor of the chalcopyrite structure is a material from which a high light absorption coefficient and a high sensitivity over a wide wavelength range are obtained and is used preferably as the N-type semiconductor thin film 41 for photoelectric conversion. Such a chemical semiconductor of the chalcopyrite structure as just described is configured using elements surrounding group IV elements such as Cu, Al, Ga, In, S, Se or the like, and CuGaInS mixed crystal, CuAlGaInS mixed crystal, CuAlGaInSSe mixed crystal and so forth are exemplified.

Further, as a material of the N-type semiconductor thin film 41, also it is possible to use, in addition to the chemical semiconductors described above, amorphous silicon (Si), germanium (Ge), a quantum dot photoelectric conversion film, an organic photoelectric conversion film and so forth.

It is assumed that, in the present embodiment, a chemical semiconductor of InGaAs is used as the N-type semiconductor thin film 41.

On the lower side that is the semiconductor substrate 12 side of the N-type semiconductor thin film 41, a P-type layer 42 of a high concentration that configures a pixel electrode is formed for each pixel. Further, between the P-type layer portions 42 of a high density formed for the individual pixels, an N-type layer portion 43 as a pixel separation region for separating each pixel 2 includes a chemical semiconductor such as, for example, InP or the like. This N-type layer portions 43 not only has a function as a pixel separation region but also has a role for preventing dark current.

On the other hand, also on the upper side that is the light incidence side of the N-type semiconductor thin film 41, an N-type layer 44 of a higher density than that of the N-type semiconductor thin film 41 is formed using a chemical semiconductor such as InP or the like that is used as the pixel separation region. This N-type layer 44 of a high concentration functions as a barrier layer that prevents backflow of charge generated by the N-type semiconductor thin film 41. As the material for the N-type layer 44 of a high concentration, chemical semiconductors such as, for example, InGaAs, InP, InAlAs and so forth can be used.

An antireflection layer 45 is formed on the N-type layer 44 of a high density as a barrier layer. As the material for the antireflection layer 45, for example, silicon nitride (SiN), hafnium oxide (HfO2), aluminum oxide ($Al_2O_3$), zirconium oxide (ZrO2), tantalum oxide (Ta2Ta5), titanium oxide (TiO2) and so forth can be used.

One of the N-type layer 44 of a high concentration and the antireflection layer 45 functions also as an upper electrode on the upper side from between electrodes that holds the N-type semiconductor thin film 41 from above and below, and the predetermined bias voltage Va is applied to the N-type layer 44 or the antireflection layer 45 as the upper electrode.

Further, color filters 46 and on-chip lenses 47 are formed on the antireflection layer 45. The color filters 46 are filters each of which passes light (wavelength light) of one of R (red), G (green) and B (blue), and such color filters 46 are disposed in a so-called Bayer array in the pixel array region 3.

A passivation layer 51 and an insulating layer 52 are formed on the lower side of the P-type layer 42 of a high concentration that configures the pixel electrodes and the N-type layers 43 as pixel separation regions. Further, connection electrodes 53A and 53B and bump electrodes 54 are formed such that they extend through the passivation layer 51 and the insulating layer 52. The connection electrodes 53A and 53B and the bump electrodes 54 electrically connect the P-type layer 42 of a high concentration configuring the pixel electrodes and the capacitive elements 22 for accumulating charge.

The ordinary pixel 2A and the charge emitting pixel 2B are configured in such a manner as described above and have a same pixel structure.

However, the ordinary pixel 2A and the charge emitting pixel 2B are different from each other in the controlling method of the reset transistor 23.

While, in each ordinary pixels 2A, the reset transistor 23 is turned on and off on the basis of the reset signal RST in response to a generation period of charge (light reception period) by the photoelectric conversion unit 21, a reset period of the potential of the capacitive element 22 before starting of light reception and so forth, in each charge emitting pixel 2B, the reset transistor 23 is normally controlled to an on state. Consequently, charge generated in the photoelectric conversion unit 21 is discharged to the ground, and a constantly fixed bias voltage Va is applied to the charge emitting pixel 2B.

Figure 4:
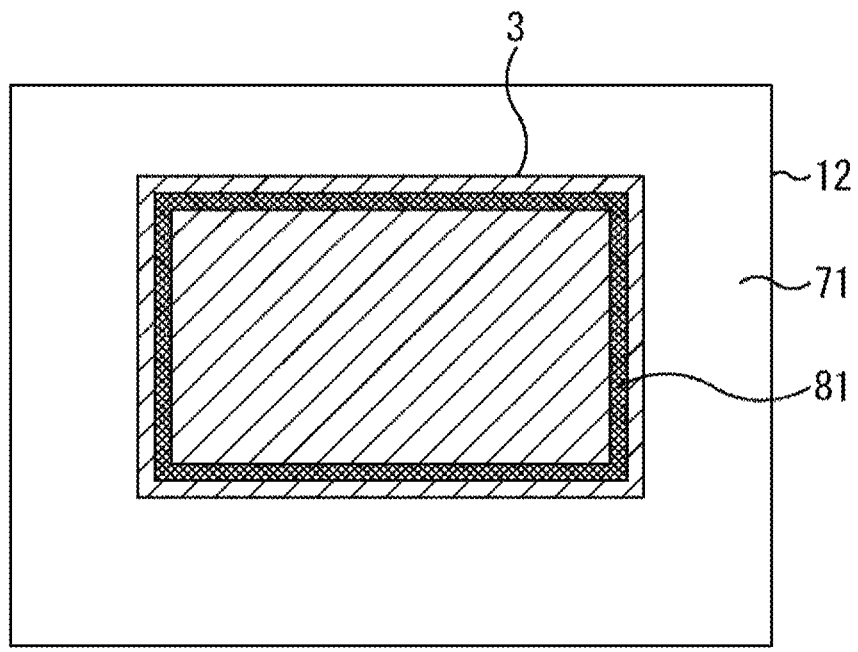
FIG. 4 is a top plan view of a pixel array region of the first embodiment.

FIG. 4 is a top plan view of the pixel array region 3 indicating a pixel disposition of the charge emitting pixels 2B.

The pixel array region 3 is disposed on the inner side of the peripheral circuit region 71 in which the vertical driving circuit 4, column signal processing circuits 5 and so forth are formed. One row and one column on the outermost side of the pixel array region 3 form as a charge emitting region 81, and the charge emitting pixels 2B are disposed in the charge emitting region 81.

It is to be noted that the charge emitting region 81 may include a plurality of rows and a plurality of columns at least including one row and one column on the outermost side of the pixel array region 3 of a rectangular shape.

In the pixels 2 positioned in the outermost side row and column of the sides of the pixel array region 3 of a rectangular shape, dark current is likely to be generated by an influence of a processed portion interface (processed portion end face) of the photoelectric conversion unit 21 of a chemical semiconductor as depicted in FIG. 3. Especially, in the case where the reading out circuit formed on the semiconductor substrate 12 is a circuit of the source follower type, since accumulation of charge decreases the potential difference of the pixel, a dark current component has an influence on successively adjacent pixels by blooming.

Therefore, in the first embodiment, the pixels 2 positioned in the outermost column and row of the sides of the pixel array region 3 of a rectangular shape are formed as the charge emitting pixels 2B that are controlled so as to normally keep the reset transistor 23 in an on state such that the springing of charge from a processed portion end face (processed portion interface) of the N-type thin film 41 serving as the photoelectric conversion unit 21 is concentrated on and discharged to the charge emitting pixel 2B. Consequently, flowing in of charge to the ordinary pixels 2A on the inner side with respect to the charge emitting region 81 can be prevented.

From the foregoing, with the first embodiment, picture quality degradation by the springing of charge from a processed portion interface of the N-type thin film 41 can be suppressed.

4. Second Embodiment

Now, a pixel structure of a second embodiment of the solid-state image pickup device 1 is described.

Figure 5:
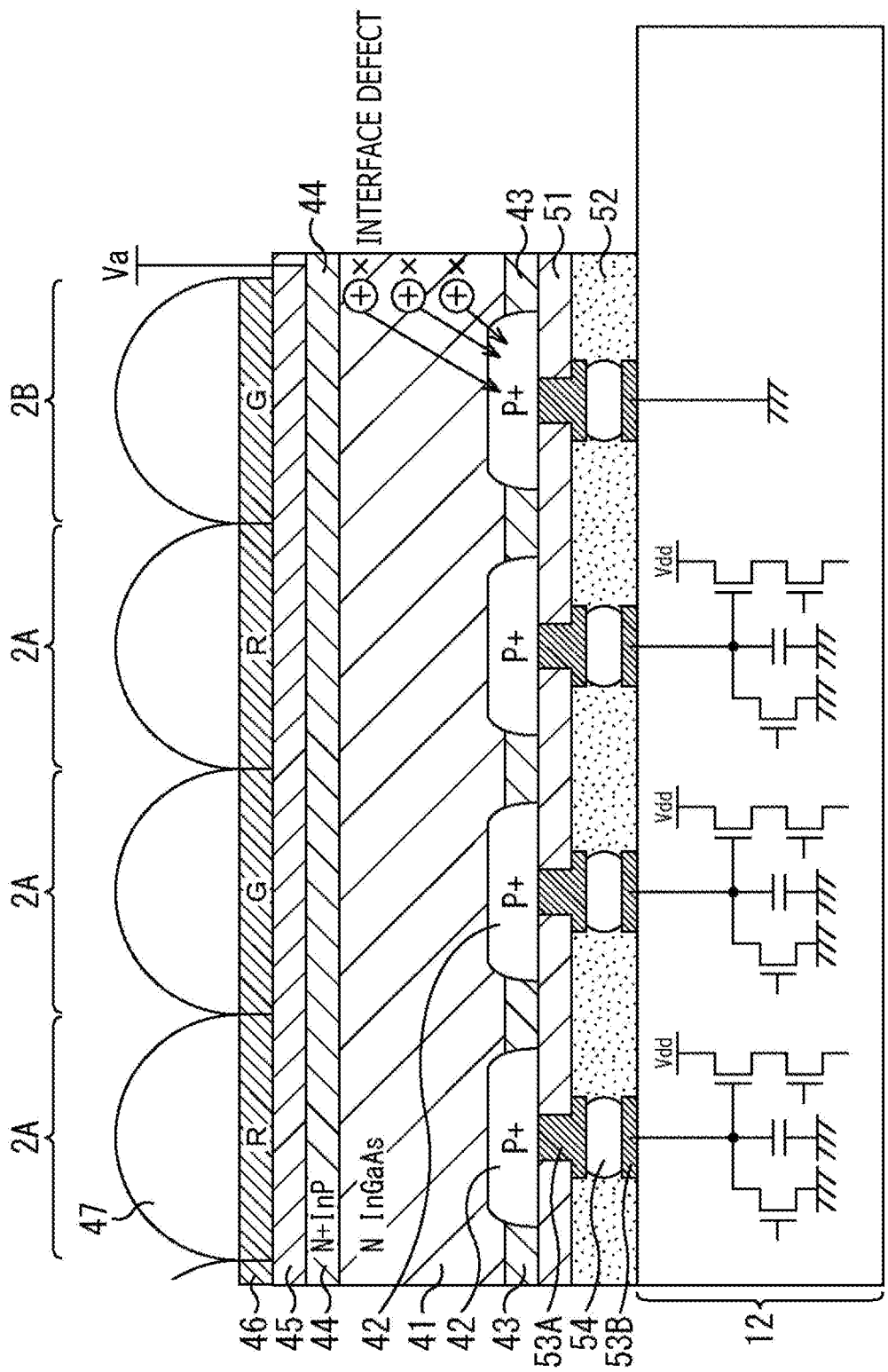
FIG. 5 is a cross sectional view depicting a pixel structure of a second embodiment.

FIG. 5 is a cross sectional view of a pixel structure of the second embodiment.

The pixel structure of the ordinary pixel 2A in the second embodiment is similar to that in the first embodiment described hereinabove and description of it is omitted.

On the other hand, the pixel structure of the charge emitting pixel 2B in the second embodiment is different from that in the first embodiment described hereinabove. In particular, while the charge emitting pixel 2B in the first embodiment includes a capacitive element 22, a reset transistor 23, an amplification transistor 24 and a selection transistor 25 similarly to the ordinary pixel 2A, the charge emitting pixel 2B in the second embodiment does not have them.

In other words, while, in the charge emitting pixel 2B in the first embodiment, the N-type semiconductor thin film 41 as the photoelectric conversion unit 21 is connected to the ground through the reset transistor 23, in the charge emitting pixel 2B in the second embodiment, the connection electrode 53B is directly connected to the ground without the intervention of the reset transistor 23. Since the reset transistor 23 does not intervene, the voltage applied to the charge emitting pixel 2B is higher than the voltage applied to the ordinary pixel 2A.

Also in the second embodiment, similarly as in the case where the reset transistor 23 is normally kept on in the first embodiment, since the springing of charge from a processed portion interface of the N-type semiconductor thin film 41 serving as the photoelectric conversion unit 21 is caused to be concentrated on the charge emitting pixel 2B and discharged, flowing in of charge into the ordinary pixel 2A on the inner side with respect to the charge emitting region 81 can be prevented.

Accordingly, also in the second embodiment, picture quality degradation by the springing of charge from a processed portion interface of the N-type semiconductor thin film 41 can be suppressed.

It is to be noted that the disposition of the charge emitting region 81 in which the charge emitting pixels 2B are disposed according to the second embodiment is similar to that in the case of the first embodiment. For example, the charge emitting region 81 can be served as one row and one column on the outermost side of the pixel array region 3 or a plurality of rows and a plurality of columns at least including one row and one column on the outermost side of the pixel array region 3.

5. Third Embodiment

Now, a pixel structure of a third embodiment of the solid-state image pickup device 1 is described.

In the third embodiment, as part of the pixel array region 3, an OPB (Optical Black) region for detecting the black level to be used as a reference is formed. The pixel structures in the third and fourth embodiments described below are a pixel structure in the case in which an OPB region is formed as part of the pixel array region 3.

Figure 6:
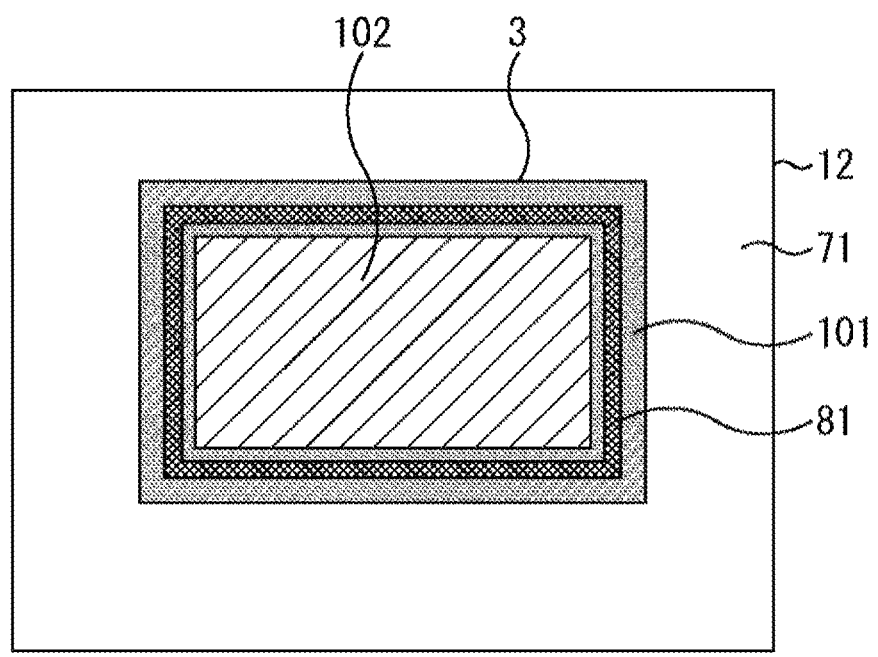
FIG. 6 is a top plan view of a pixel array region of a third embodiment.

FIG. 6 is a top plan view depicting disposition of the charge emitting region 81 in the case where an OPB region is formed as part of the pixel array region 3.

In the case where the OPB region 101 is formed as part of the pixel array region 3, the OPB region 101 is configured from a plurality of columns and a plurality of rows on the outermost side of the sides of the pixel array region 3 of a rectangular shape as depicted in FIG. 6. Further, one row and one column on the most inner side of the OPB region 101 are set as the charge emitting region 81.

The region on the inner side of the pixel array region 3 with respect to the OPB region 101 is the effective pixel region 102 in which the ordinary pixels 2A that output a pixel signal according to the received light amount are disposed.

Figure 7:
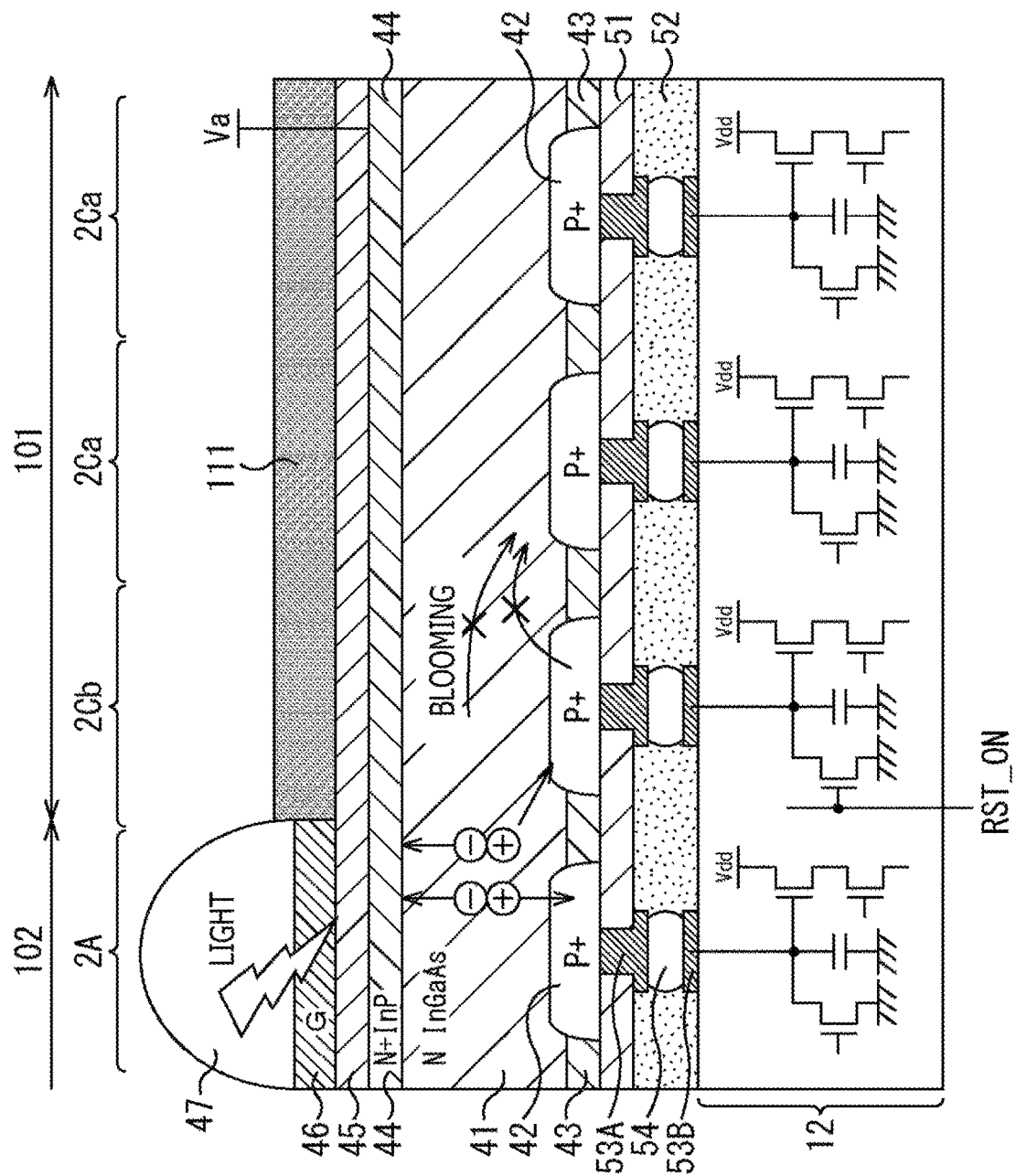
FIG. 7 is a cross sectional view depicting a pixel structure of the third embodiment.

FIG. 7 is a cross sectional view depicting a pixel structure of the third embodiment.

In the OPB region 101, OPB pixels 2C (2Ca, 2Cb) are disposed. On the OPB pixels 2C, a light shielding film 111 is formed in place of the color filters 46 and the on-chip lenses 47 on the upper side of the N-type semiconductor thin film 41 serving as the photoelectric conversion unit 21. The light shielding film 111 includes a metal material of, for example, tungsten (W), aluminum (Al), gold (Au) or the like.

In the OPB region 101, three OPB pixels 2C forming, for example, three rows or three columns are disposed in a juxtaposed relationship with each other, and the OPB pixel 2C on the innermost side among them (center side of the pixel array region 3) is the charge emitting OPB pixel 2Cb in which the reset transistor 23 is controlled so as to be normally kept on similarly as in the first embodiment described hereinabove.

On the other hand, the two OPB pixels 2C on the outer sides within the OPB region 101 in which the three OPB pixels 2C that form three rows or three columns are disposed in a juxtaposed relationship with each other serve as black level reading out OPB pixels 2Ca that are controlled so as to read out the black level.

The configuration of the other part in the third embodiment is similar to that in the first embodiment described hereinabove.

For example, when light of a high illuminance is irradiated upon the pixel array region 3 of the solid-state image pickup device 1, there is the possibility that blooming may occur with the ordinary pixel 2A most adjacent the OPB region 101 and have an influence on the adjacent OPB pixel 2C, namely, the OPB pixel 2C on the innermost side of the OPB region 101. Further, there is the possibility that light incident to the ordinary pixel 2A most adjacent the OPB region 101 may leak into the adjacent OPB pixel 2C, with which blooming may occur.

Therefore, in the third embodiment, by forming the OPB pixel 2C on the innermost side of the OPB region 101 as the charge emitting OPB pixel 2Cb in which the reset transistor 23 is controlled so as to be normally kept on, occurrence of blooming can be stopped at the charge emitting OPB pixel 2Cb, and flowing of charge into the adjacent black level reading out OPB pixel 2Ca can be prevented.

Consequently, with the third embodiment, picture quality degradation by occurrence of blooming can be suppressed.

6. Fourth Embodiment

Now a pixel structure of a fourth embodiment of the solid-state image pickup device 1 is described.

Figure 8:
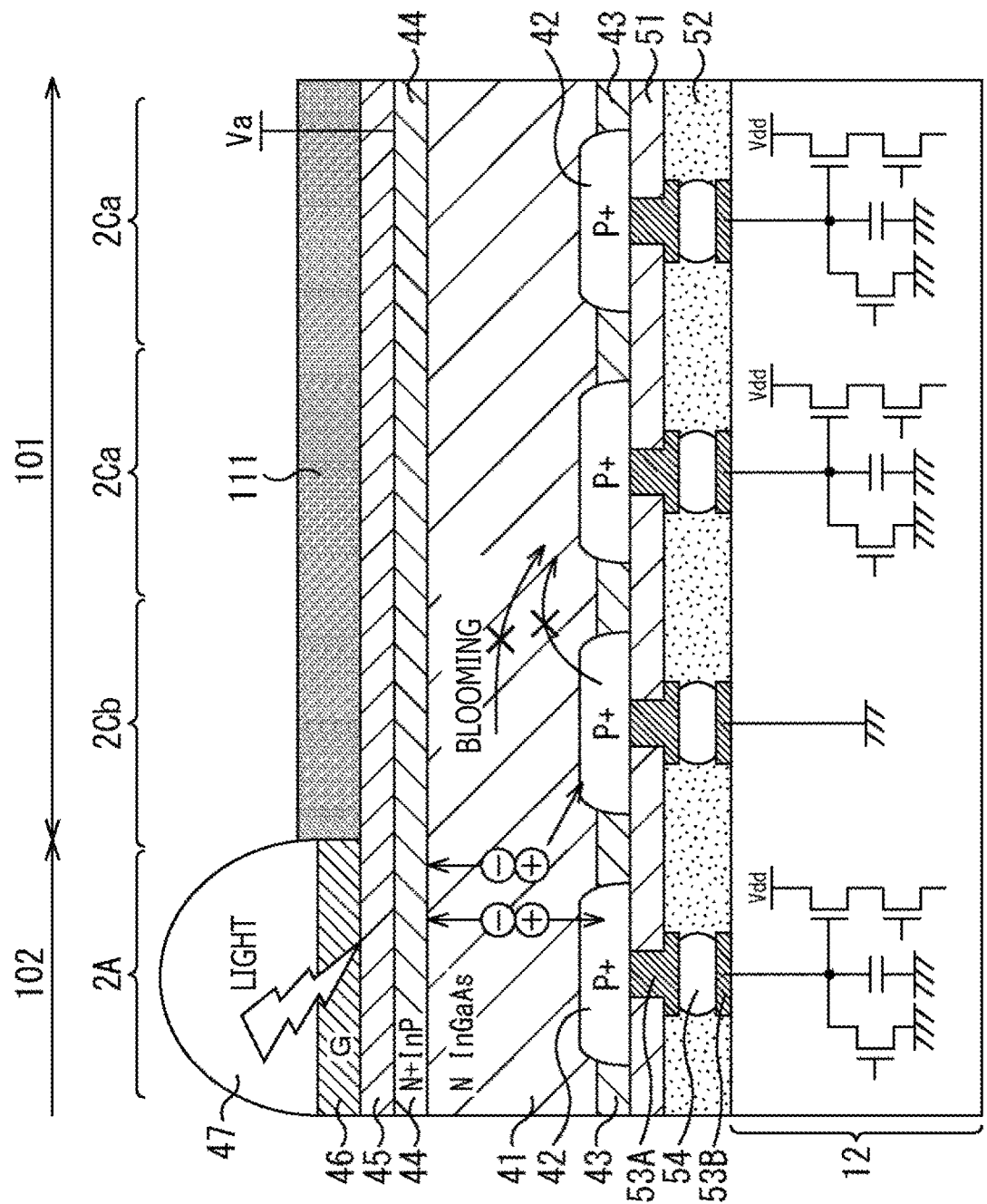
FIG. 8 is a cross sectional view depicting a pixel structure of a fourth embodiment.

FIG. 8 is a cross sectional view depicting a pixel structure of the fourth embodiment.

In the fourth embodiment depicted in FIG. 8, the pixel structure of the charge emitting OPB pixel 2Cb on the innermost side of the OPB region 101 is a structure in which the connection electrode 53B is directly connected to the ground similarly as in the second embodiment described hereinabove.

The configuration of the other part in the fourth embodiment is similar to that in the third embodiment described hereinabove.

Also in this case, similarly as in the case in which the reset transistor 23 of the charge emitting OPB pixel 2Cb in the third embodiment is normally kept on, occurrence of blooming can be stopped at the charge emitting OPB pixel 2Cb, and flowing of charge into the adjacent black level reading out OPB pixel 2Ca can be prevented.

Accordingly, also in the fourth embodiment, picture quality degradation by occurrence of blooming can be suppressed.

It is to be noted that the disposition of the charge emitting region 81 in which the charge emitting OPB pixel 2Cb is disposed is same as that of the charge emitting region 81 described hereinabove with reference to FIG. 6.

In the description of the third and fourth embodiments described hereinabove, an example is described in which the charge emitting region 81 (charge emitting OPB pixel 2Cb) serves as pixels 2 of one row one column on the innermost side of the OPB region 101.

However, in the charge emitting region 81, one row and one column of the OPB region 101 may be configured at least from a plurality of rows and a plurality of columns. For example, the charge emitting region 81 can be configured from a rectangular region including one row and one column on the innermost side of the OPB region 101 and one row and one column on outermost side of the effective pixel region 102. Further, for example, the charge emitting region 81 can be configured from a rectangular region including a plurality of rows and a plurality of columns of the OPB region 101. In the case where the charge emitting region 81 is configured from a rectangular region including a plurality of rows and a plurality of columns of the OPB region 101, the charge emitting region 81 may not include one row and one column on the innermost side of the OPB region 101.

7. Process of Photoelectric Conversion Unit Processed End

Incidentally, the first and second embodiments described hereinabove are directed to the structure that prevents flowing of charge into the ordinary pixel 2A on the inner side with respect to the charge emitting region 81 by providing the charge emitting region 81 (charge emitting pixel 2B) in the proximity of a processed portion end face of the photoelectric conversion unit 21, at which dark current is likely to appear, such that charge is discharged from the charge emitting region 81 (charge emitting pixel 2B).

Therefore, in the following, a structure that causes dark current to be generated less likely at a processed portion end face of the photoelectric conversion unit 21 is described.

<First Processed Portion End Face Structure>

Figure 9:
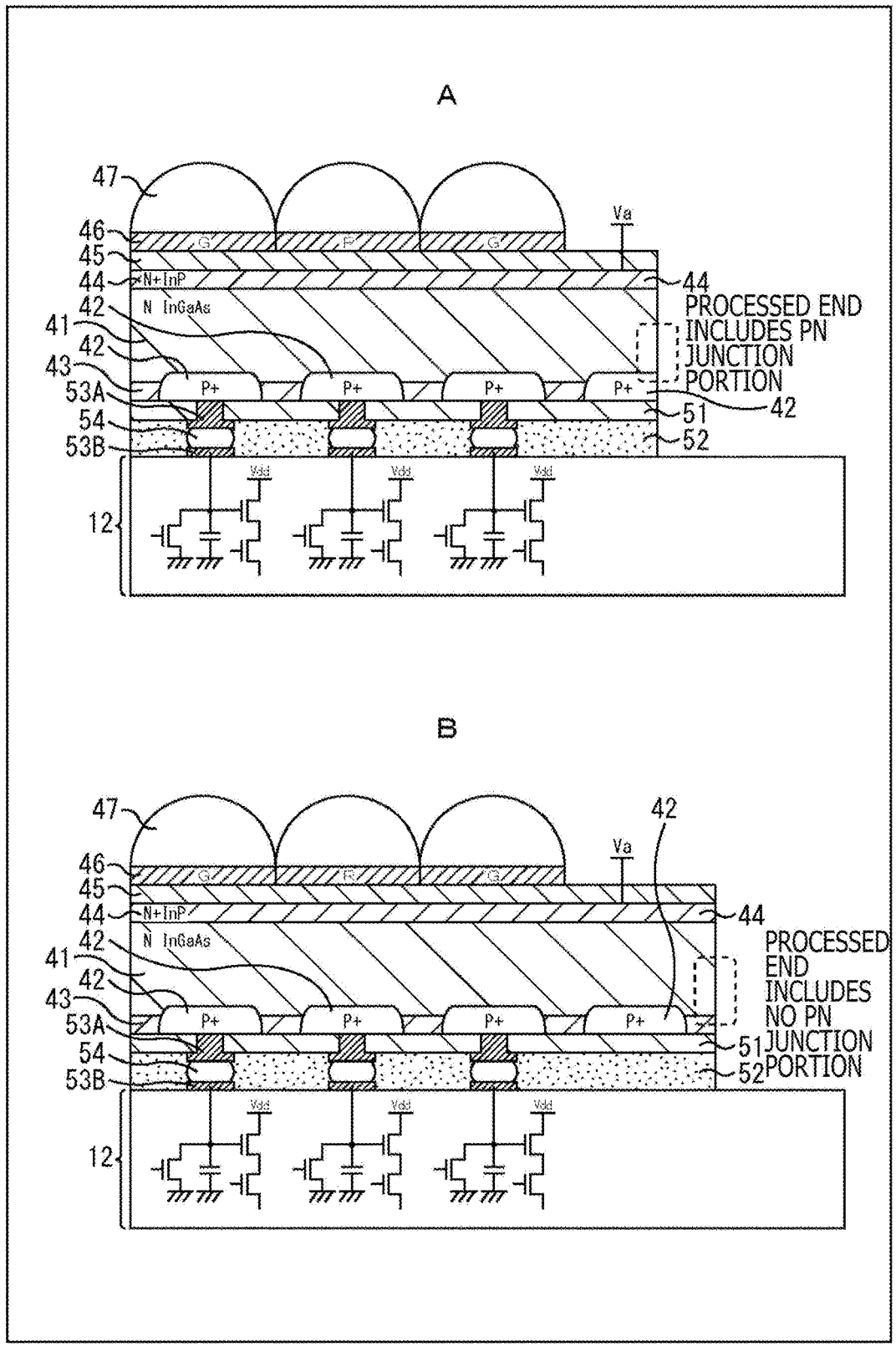
FIG. 9 is a view illustrating a first processed portion end face structure.

FIG. 9 is a view illustrating a first processed portion end face structure that suppresses dark current at a processed portion end face of the photoelectric conversion unit 21.

A of FIG. 9 depicts a structure in which the P-type layer 42 of a high concentration is disposed at a processed portion end face of the photoelectric conversion unit 21 such that a PN junction portion configured from an N-type semiconductor thin film 41 and a P-type layer 42 of a high concentration is included at the processed portion end face of the photoelectric conversion unit 21.

Meanwhile, B of FIG. 9 depicts a structure in which the P-type layer 42 of a high concentration is not disposed at a processed portion end face of the photoelectric conversion unit 21 such that a PN junction portion configured from an N-type semiconductor thin film 41 and a P-type layer 42 of a high concentration is not included at the processed portion end face of the photoelectric conversion unit 21.

As the first processed portion end face structure for the photoelectric conversion unit 21, such a structure in which a PN junction portion configured from the N-type semiconductor thin film 41 and the P-type layer 42 of a high concentration is not disposed at the processed portion end face as depicted in B of FIG. 9 can be adopted. By adopting the structure described, the electric field at the processed portion end face can be weakened in comparison with that in an alternative case in which a PN junction portion is disposed on the processed portion end face, and therefore, the springing of charge from the processed portion end face can be suppressed to suppress dark current.

<Second Processed Portion End Face Structure>

Figure 10:
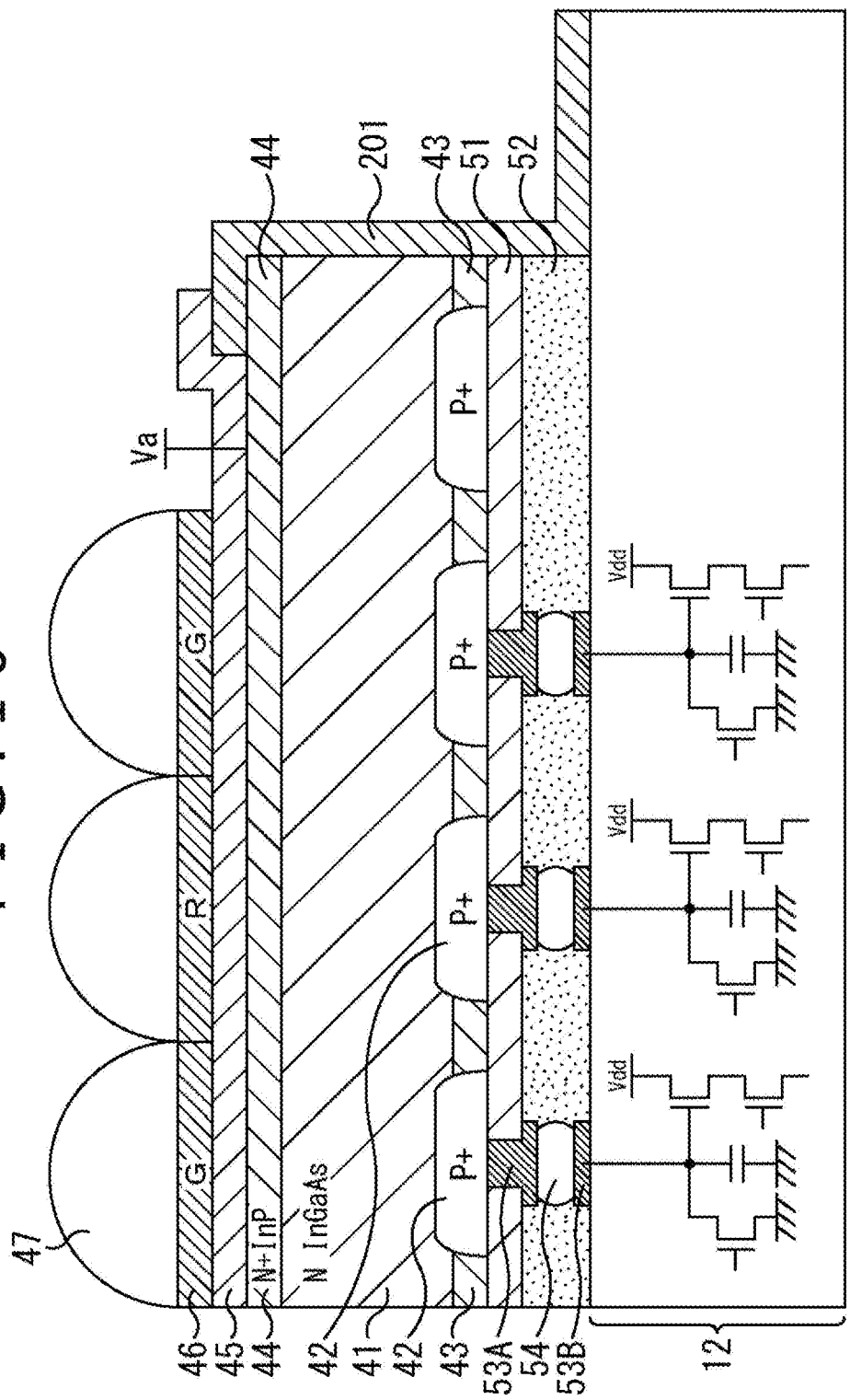
FIG. 10 is a view illustrating a second processed portion end face structure.

FIG. 10 depicts a second processed portion end face structure that suppresses dark current at a processed portion end face of the photoelectric conversion unit 21.

The second processed portion end face structure of the photoelectric conversion unit 21 can be made a structure in which a PN junction portion is not included in a processed portion end face of the photoelectric conversion unit 21 as depicted in B of FIG. 9 and the processed portion end face is configured by being covered with a protective film (hereinafter referred to as fixed charge film) 201 having fixed charge as depicted in FIG. 10.

As the material for the fixed charge film 201, for example, silicon oxide (SiO2), silicon nitride (SiN), aluminum oxide (Al2O3), hafnium oxide (HfO2) and so forth can be used.

In the case where the photoelectric conversion unit 21 is the N-type semiconductor thin film 41 and the signal charge is pores as in the present embodiment, the fixed charge film 201 is a film having positive fixed charge. On the contrary, for example, in the case where the photoelectric conversion unit 21 is a P-type semiconductor thin film and the signal charge is electrons, the fixed charge film 201 is a film having negative fixed charge.

By forming the fixed charge film 201 on a processed portion end face of the photoelectric conversion unit 21 in this manner, the springing of charge from the processed portion end face can be suppressed to suppress dark current.

<Third Processed Portion End Face Structure>

Figure 11:
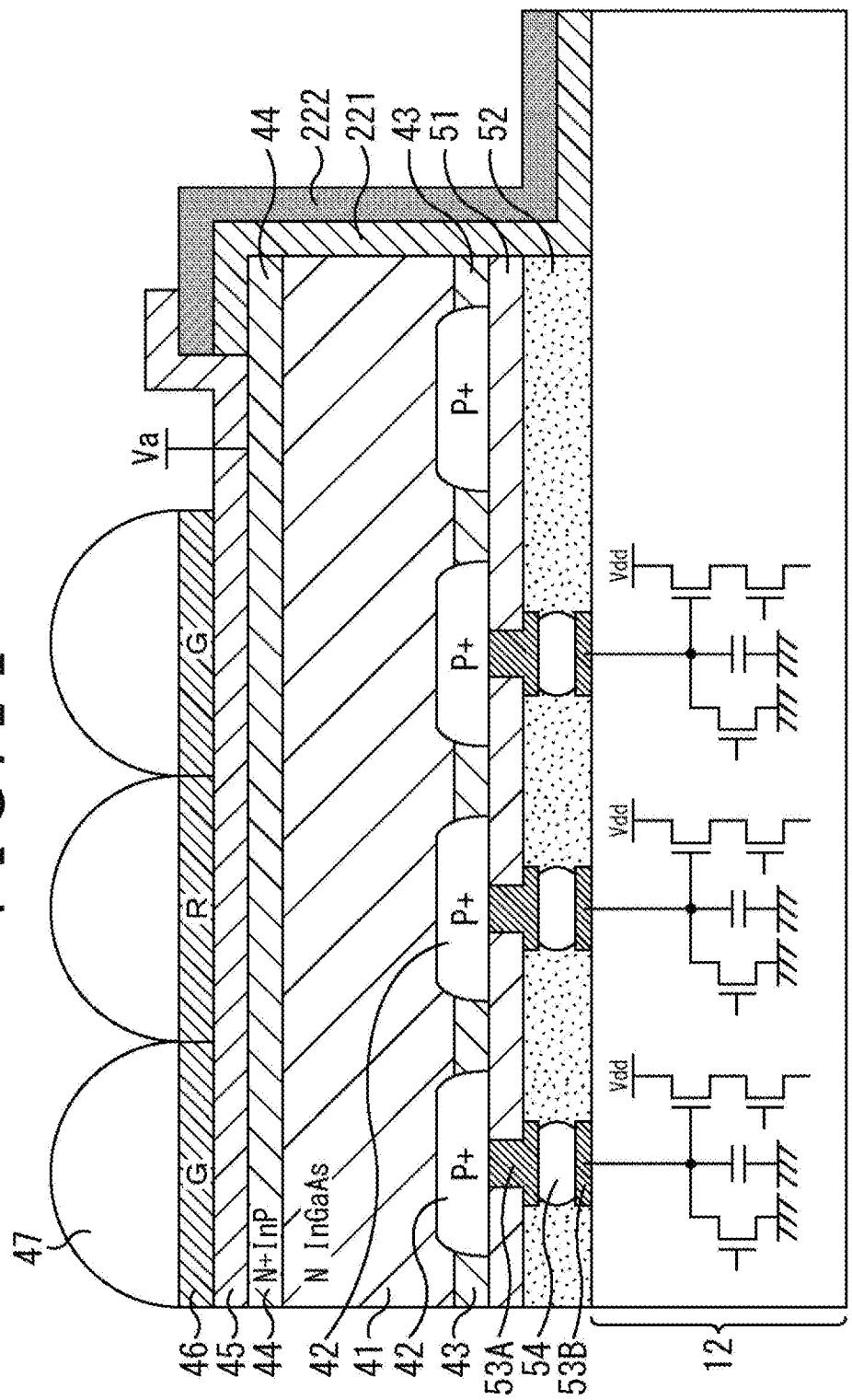
FIG. 11 is a view illustrating a third processed portion end face structure.

FIG. 11 depicts a third processed portion end face structure that suppresses dark current at a processed portion end face of the photoelectric conversion unit 21.

In the third processed portion end face structure of the photoelectric conversion unit 21, a PN junction portion is not included in a processed portion end face of the photoelectric conversion unit 21 as depicted in B of FIG. 9 and an insulating film 221 and a metal film 222 are formed on the processed portion end face and joined to an N-type semiconductor thin film 41 thereby to form a MIS structure as depicted in FIG. 11. A predetermined bias voltage is applied to the metal film 222. In the case where the photoelectric conversion unit 21 is the N-type semiconductor thin film 41 and the signal charge is pores as in the present embodiment, a positive bias voltage is applied to the metal film 222. On the contrary, for example, in the case where the photoelectric conversion unit 21 is a P-type semiconductor thin film and the signal charge is electrons, a negative bias voltage is applied to the metal film 222.

As the material for the insulating film 221, for example, silicon oxide (SiO2), silicon nitride (SiN), aluminum oxide (Al2O3), hafnium oxide (HfO2) and so forth can be used. As the material for the metal film 222, for example, tungsten (W), aluminum (Al), gold (Au) and so forth can be used.

By forming a processed portion end face of the photoelectric conversion unit 21 in a MIS structure and applying a predetermined bias voltage to the metal film 222 in this manner, the springing of charge from the processed portion end face can be suppressed to suppress dark current.

8. Summary of First to Fourth Embodiments

As described above, by adopting the first to third processed portion end face structures as the structure of a processed portion end face of the photoelectric conversion unit 21, the springing of charge from the processed portion end face can be suppressed to suppress dark current.

Further, by adopting the pixel structure of one of the first to fourth embodiments described above, the springing of charge from the processed portion end face can be prevented from flowing into the ordinary pixel 2A that is an effective pixel on the inner side of the pixel array region 3.

Accordingly, picture quality degradation by the springing of charge from the processed portion end face of the photoelectric conversion unit 21 can be suppressed. Further, by the adoption of the structure that suppresses the springing of charge from the processed portion end face, ineffective pixels can be disposed in the minimum, and the chip area of the entire solid-state image pickup device 1 can be reduced and also the fabrication cost can be reduced.

It is to be noted that the pixel structure of one of the first to fourth embodiments described above and the first to third processed portion end face structures described above can be combined arbitrarily. In the solid-state image pickup device 1, by adopting the pixel structure of one of the first to fourth embodiments described above or one of the first to third processed portion end face structures described above, an advantageous effect to suppress picture quality degradation by the springing of charge from the processed portion end face of the photoelectric conversion unit 21 can be demonstrated.

9. Fifth Embodiment

Now, a pixel structure is described which implements a high dynamic range in a pixel 2 in which the photoelectric conversion unit 21 has one of a chemical semiconductor, amorphous silicon, germanium, a quantum dot photoelectric conversion film and an organic photoelectric conversion film.

A method of adjusting the voltage to be applied to a photoelectric conversion film such that a saturation level of a pixel may not be exceeded in order to implement a high dynamic range in a solid-state image pickup device is known (for example, JP 2009-49525A). Meanwhile, as another method for implementing a high dynamic range, a method by which a changeover switch is provided in a capacitive portion for accumulating charge such that a high S/N ratio and a high dynamic range are implemented (for example, JP 2007-516654T) and a method by which a high sensitivity and a high dynamic range are implemented by disposing a charge accumulation portion capacitance in a layered structure with a photodiode in the opposite direction to the light incidence direction to the photodiode (JP 2014-112580A) are known.

Since a quantum infrared image sensor represented by InGaAs or the like adopts long wavelength light, the band gap thereof is narrower than that of silicon (Si) and dark current is liable to spring. On the other hand, since a reading out circuit of the source follower type accumulates charge to read out a signal, in order to assure a dynamic range, it is necessary to set the voltage to be applied to the photoelectric conversion unit high or make the capacitance high.

However, if the voltage applied to the photoelectric conversion unit is set high, then the conversion efficiency degrades, and therefore, the S/N ratio degrades. On the other hand, in the case where the capacitance of the capacitance element is increased, since the conversion efficiency decreases, the S/N ration degrades. Therefore, in a quantum type infrared image sensor having a reading out circuit of the source follower type, the dynamic range and the dark current and conversion efficiency have a tradeoff relationship to each other.

Figure 12:
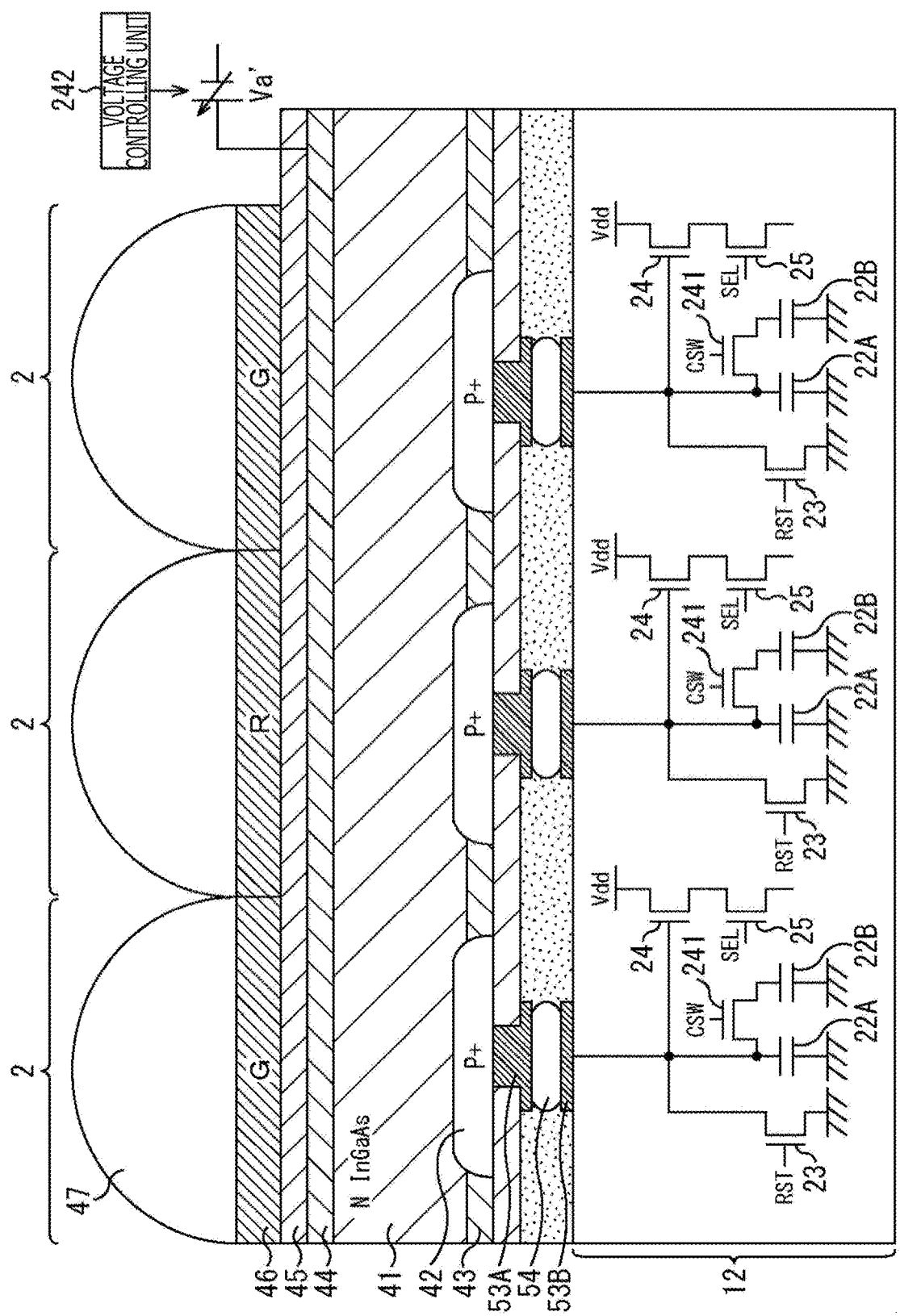
FIG. 12 is a cross sectional view depicting a pixel structure of a fifth embodiment.

FIG. 12 is a cross sectional view depicting a pixel structure of a fifth embodiment of the solid-state image pickup device 1, which implements a high dynamic range.

Referring to FIG. 12, portions corresponding to those of the first to fourth embodiments described hereinabove are denoted by same reference characters, and while description of them is suitably omitted, description is given paying attention to portions different from those of the first to fourth embodiments described hereinabove.

In the fifth embodiment, a reading out circuit of a capacitive element 22, a reset transistor 23, an amplification transistor 24 and a selection transistor 25 is formed for each pixel on a semiconductor substrate 12 similarly as in the first to fourth embodiments described hereinabove.

However, in the fifth embodiment, as the capacitive element 22, two capacitive elements 22A and 22B are formed, and the two capacitive elements 22A and 22B are connected in parallel through a changeover controlling transistor 241 provided newly in each pixel 2. The changeover controlling transistor 241 changes over the parallel connection of the two capacitive elements 22A and 22B between on and off in accordance with a changeover signal CSW supplied from the vertical driving circuit 4 (FIG. 1).

The vertical driving circuit 4 controls the changeover controlling transistor 241 by supplying the changeover signal CSW of a predetermined level (high or low) to the changeover controlling transistor 241 of each pixel 2 in response to a surrounding environment of the solid-state image pickup device 1, namely, in response to a light amount or a temperature. The light amount at present of the solid-state image pickup device 1 is decided on the basis of a pixel output in an immediately preceding frame. Further, if the temperature becomes higher by an influence of the use environment, then since the dark current increases, the temperature at present of the solid-state image pickup device 1 is decided on the basis of a pixel output of the OPB pixel 2C.

For example, in the case where the light amount is great and a pixel 2 by which a saturation level is reached exists, the vertical driving circuit 4 turns on the changeover controlling transistor 241 to increase the accumulation capacitance of the capacitive elements 22A and 22B, but in the case where the light amount is small and a pixel 2 by which a saturation level is reached does not exist, the vertical driving circuit 4 turns off the changeover controlling transistor 241 to degrease the accumulation capacitance of the capacitive elements 22A and 22B.

Further, in the case where dark current is much (is equal to or higher than a predetermined current value), the vertical driving circuit 4 turns on the changeover controlling transistor 241 to increase the accumulation capacitance of the capacitive elements 22A and 22B, but in the case where dark current is little (is smaller than the predetermined current value), the vertical driving circuit 4 turns off the changeover controlling transistor 241 to decrease the accumulation capacitance of the capacitive elements 22A and 22B.

Further, in the fifth embodiment, a voltage controlling unit 242 for variably controlling the bias voltage Va' to be applied to the photoelectric conversion unit 21 is provided newly. The voltage controlling unit 242 may be provided additionally in the solid-state image pickup device 1, or, for example, may be provided as part of the control circuit 8 or the vertical driving circuit 4.

The voltage controlling unit 242 varies the bias voltage Va' to be applied to the photoelectric conversion unit 21 in response to a surrounding environment of the solid-state image pickup device 1, in particular, in response to a light amount or a temperature. The light amount at present of the solid-state image pickup device 1 is decided on the basis of a pixel output in an immediately preceding frame. Further, if the temperature becomes higher by an influence of the use environment, then since dark current increases, the temperature at present of the solid-state image pickup device 1 is decided on the basis of a pixel output of the OPB pixel 2C.

For example, in the case where the light amount is great and a pixel 2 in which a saturation level is reached exists, the voltage controlling unit 242 increases the bias voltage Va', but in the case where the light amount is small and a pixel 2 in which the saturation level is reached does not exist, the voltage controlling unit 242 decreases the bias voltage Va'.

Further, in the case where dark current is much (equal to or higher than a predetermined current value), the voltage controlling unit 242 increases the bias voltage Va', but in the case where dark current is little (lower than the predetermined current value), the voltage controlling unit 242 decreases the bias voltage Va'. It is to be noted that the voltage controlling unit 242 may change the reset voltage of the reset transistor 23 in place of changing the bias voltage Va'. Also in this case, a similar advantageous effect can be demonstrated.

The control of the bias voltage Va' by the voltage controlling unit 242 and the control of the accumulation capacitance by the vertical driving circuit 4 may be performed independently of each other or may be controlled in combination.

For example, in the case where the control of the bias voltage Va' and the control of the accumulation capacitance are combined, such controls of four stages as given below can be performed in response to the light amount.

(a) Light amount level 1: bias voltage Va1', accumulation capacitance low (parallel connection off)
(b) Light amount level 2: bias voltage Va1', accumulation capacitance high (parallel connection on)
(c) Light amount level 3: bias voltage Va2', accumulation capacitance high (parallel connection on)
(d) Light amount level 4: bias voltage Va3', accumulation capacitance high (parallel connection on)

Here, the relationship in magnitude of the light amount levels 1 to 4 and the bias voltages Va1' to Va3' is the light amount level 1<light amount level 2<light amount level 3<light amount level 4 and bias voltage Va1'<bias voltage Va2'<bias voltage Va3'.

The vertical driving circuit 4 may control the changeover controlling transistor 241 of each pixel 2 simultaneously for all pixels of the pixel array region 3 or may control the changeover controlling transistor 241 for each of a plurality of areas into which the pixel array region 3 is divided. Alternatively, the vertical driving circuit 4 may control the changeover controlling transistor 241 for each of the pixels of the pixel array region 3.

The voltage controlling unit 242 may control the bias voltage Va' to be applied to the photoelectric conversion unit 21 simultaneously for all pixels of the pixel array region 3 or may control the bias voltage Va' for each of a plurality of areas into which the pixel array region 3 is divided. Alternatively, the vertical driving circuit 4 may control the bias voltage Va' for each of the pixels of the pixel array region 3.

With the solid-state image pickup device 1 of the fifth embodiment, in the case where the light amount is small, dark current can be suppressed by decreasing the bias voltage Va' to be applied to the photoelectric conversion unit 21, and the S/N ratio can be improved. Further, since the conversion efficiency increases if the accumulation capacitance of the capacitive elements 22A and 22B is reduced, then the S/N ratio increases.

On the other hand, in the case where the light amount is great, the dynamic range can be increased and a higher dynamic range can be implemented by increasing the bias voltage Va' to be applied to the photoelectric conversion unit 21 to increase the accumulation capacitance of the capacitive elements 22A and 22B. In this case, although dark current increases or the conversion efficiency decreases, since the signal amount is great, the influence of picture quality degradation is little.

Accordingly, with the solid-state image pickup device 1 of the fifth embodiment, improvement of the S/N ratio and a high dynamic range can be implemented in response to the surrounding environment of the solid-state image pickup device 1.

<Application Example to Electronic Apparatus>

The present technology is not limited to application to a solid-state image pickup device. In particular, the present technology can be applied to various electronic apparatus that use a solid-state image pickup device in an image fetching unit (photoelectric conversion unit) such as an image pickup apparatus such as a digital still camera, a video camera or the like, a portable terminal apparatus having an image pickup function, a copying machine that uses a solid-state image pickup device in an image reading unit and so forth. The solid-state image pickup device may have a form of a one-chip device or may have a form of a module in which an image pickup unit and a signal processing section or an optical system are collectively packaged and which has an image pickup function.

Figure 13:
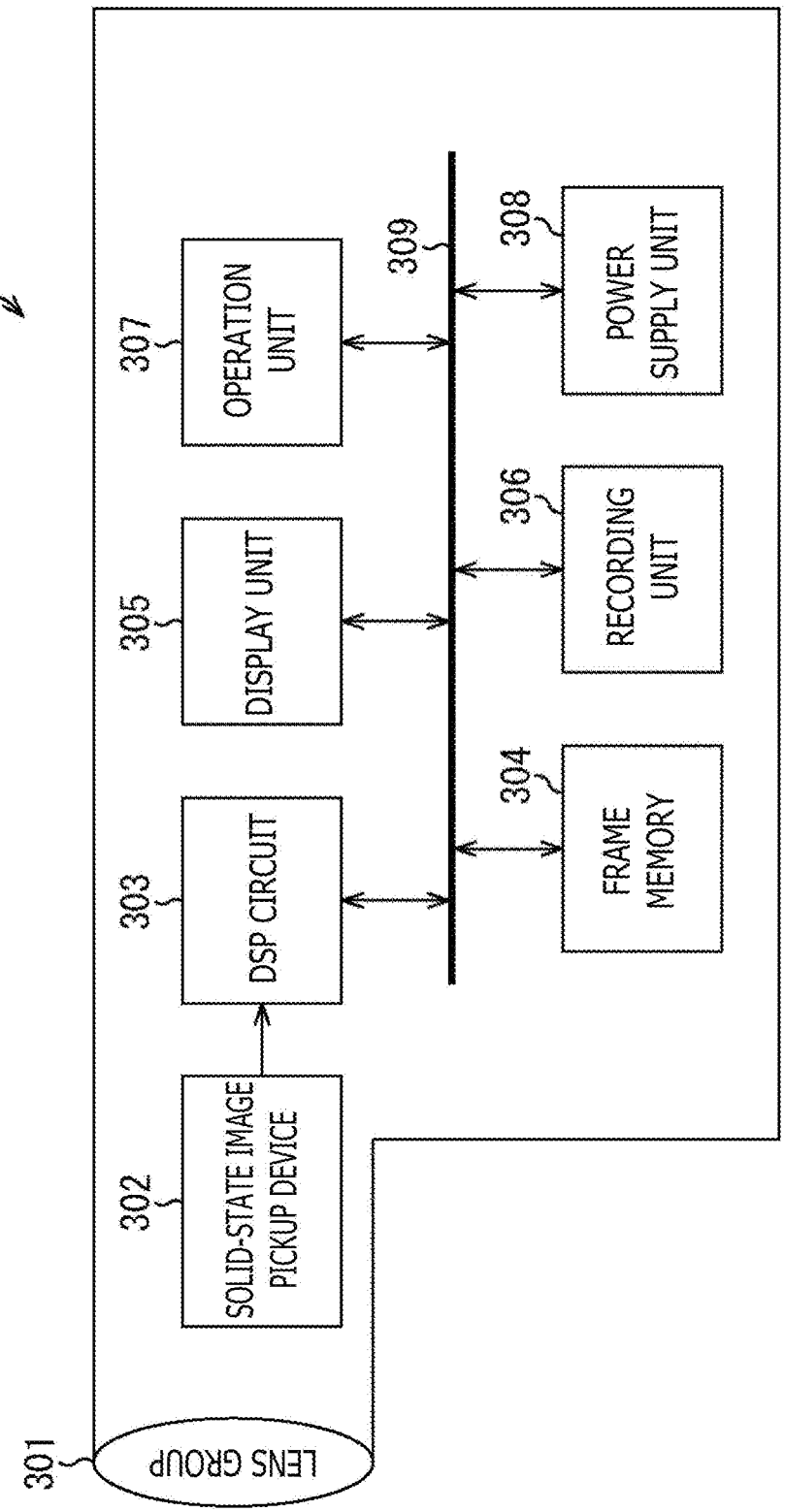
FIG. 13 is a block diagram depicting an example of a configuration of an image pickup apparatus as an electronic apparatus to which the present technology is applied.

FIG. 13 is a block diagram depicting an example of a configuration of an image pickup apparatus as an electronic apparatus to which the present technology is applied.

The image pickup apparatus 300 of FIG. 13 includes an optical unit 301 configured from a lens group and so forth, a solid-state image pickup device (image pickup device) 302 for which the configuration of the solid-state image pickup device 1 of FIG. 1 is adopted, and a DSP (Digital Signal Processor) circuit 303 that is a camera signal processing circuit. Further, the image pickup apparatus 300 includes a frame memory 304, a display unit 305, a recording unit 306, an operation unit 307 and a power supply unit 308 as well. The DSP circuit 303, frame memory 304, display unit 305, recording unit 306, operation unit 307 and power supply unit 308 are connected to each other through a bus line 309.

The optical unit 301 fetches incident light (image light) from an image pickup object and forms an image on an image pickup plane of the solid-state image pickup device 302. The solid-state image pickup device 302 converts the amount of incident light, from which an image is formed on the image pickup plane by the optical unit 301, into an electric signal in a unit of a pixel and outputs the electric signal as a pixel signal. As this solid-state image pickup device 302, the solid-state image pickup device 1 of FIG. 1, for example, a solid-state image pickup device that suppresses picture quality degradation by the springing of charge from a processed portion end face of the photoelectric conversion unit 21, can be used.

The display unit 305 is configured from a panel type display apparatus such as, for example, a liquid crystal panel, an organic EL (Electro Luminescence) panel or the like and displays a moving picture or a still picture picked up by the solid-state image pickup device 302. The recording unit 306 records a moving picture or a still picture picked up by the solid-state image pickup device 302 on a recording medium such as a hard disk, a semiconductor memory or the like.

The operation unit 307 issues an operation command for various functions the image pickup apparatus 300 has under an operation by a user. The power supply unit 308 suitably supplies various kinds of power, which serves as an operation power supply for the DSP circuit 303, frame memory 304, display unit 305, recording unit 306 and operation unit 307, to the supply targets.

By using the solid-state image pickup device 1 to which any of the embodiments described above is applied as the solid-state image pickup device 302 as described above, picture quality degradation, for example, by the springing of charge from a processed portion end face of the photoelectric conversion unit 21 can be suppressed. Further, improvement of the S/N ratio and a high dynamic range can be implemented. Accordingly, high picture quality of a picked up image can be achieved also with the image pickup apparatus 300 such as a video camera, a digital still camera, a camera module for use with a mobile apparatus such as a portable telephone set or the like and so forth.

<Example of Use of Image Sensor>

Figure 14:
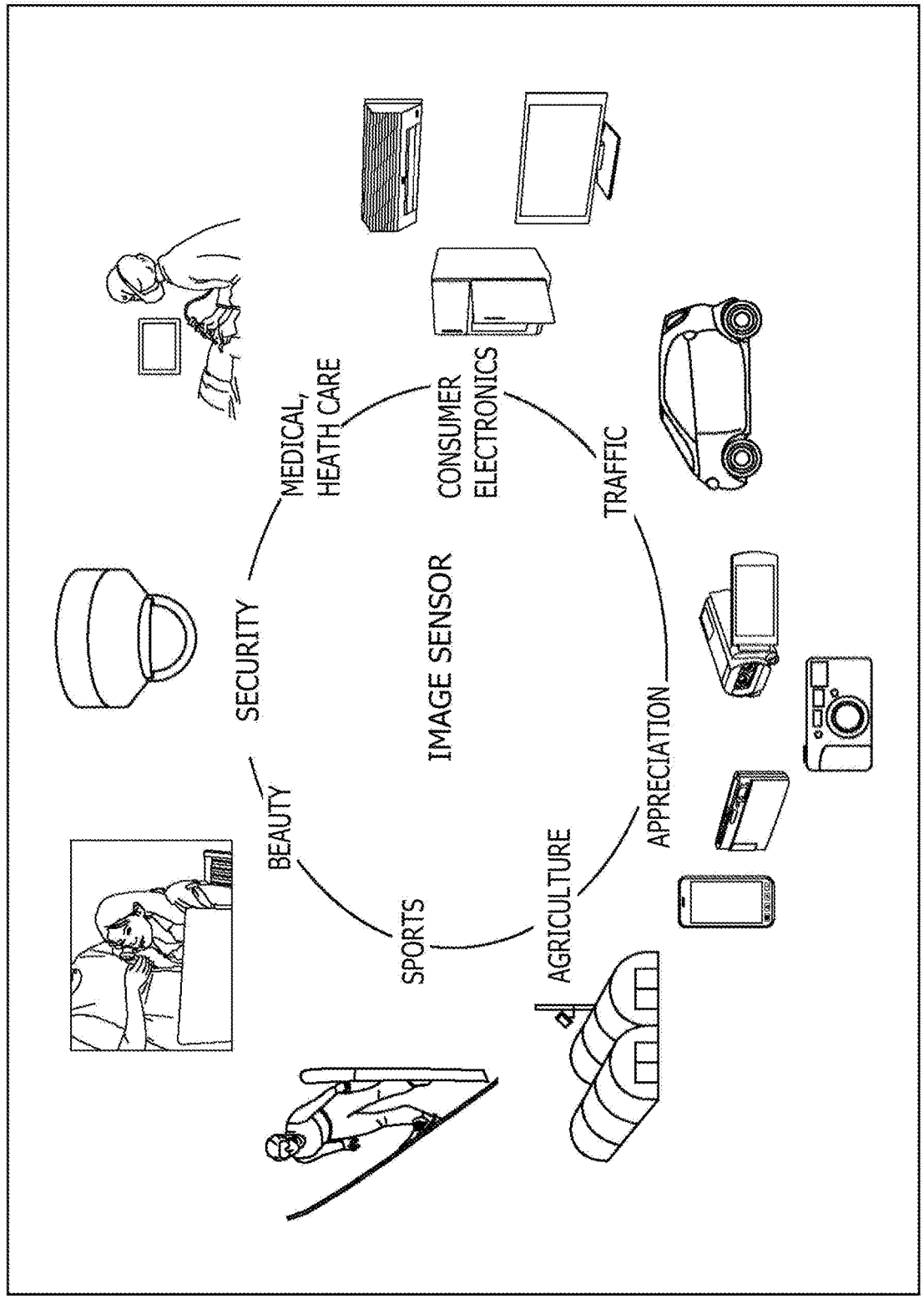
FIG. 14 is a view illustrating an example of use of the solid-state image pickup device of FIG. 1.

FIG. 14 is a view depicting an example of use of an image sensor for which the solid-state image pickup device 1 described hereinabove is used.

The image sensor for which the solid-state image pickup device 1 described hereinabove is used can be used in various cases in which light of, for example, visible rays, infrared rays, ultraviolet rays, X rays and so forth is to be sensed as described below.

An apparatus that picks up an image to be used for appreciation such as a digital camera, a portable apparatus with a camera function and so forth.

An apparatus that is used for traffic such as an in-vehicle sensor for picking up an image of the front, the rear, surroundings, the inside of the vehicle or the like for the object of recognition of a state by a driver or the like, a monitoring camera for monitoring a traveling vehicle or a road, a distance measurement sensor for performing distance measurement such as an inter-vehicular distance or the like An apparatus for use with consumer electronics such as a TV, a refrigerator, an air conditioner or the like in order to pick up an image of a gesture of a user and perform an apparatus operation in accordance with the gesture An apparatus for use for medical care or health care such as an endoscope, an apparatus for performing angiography by reception of infrared rays and so forth An apparatus for use for security such as a surveillance camera for security use, a camera for people authentication purpose and so forth An apparatus for beauty such as a skin measuring instrument, a microscope for picking up an image of the scalp and so forth An apparatus for use for sports such as an action camera, a wearable camera and so forth for sports applications An apparatus for agricultural use such as a camera for monitoring a state of a field or crops and so forth 10. Application Example to Endoscope Surgery System The technology according to the present disclosure (present technology) can be applied to various products. For example, the technology according to the present disclosure may be applied to an endoscope surgery system.

Figure 15:
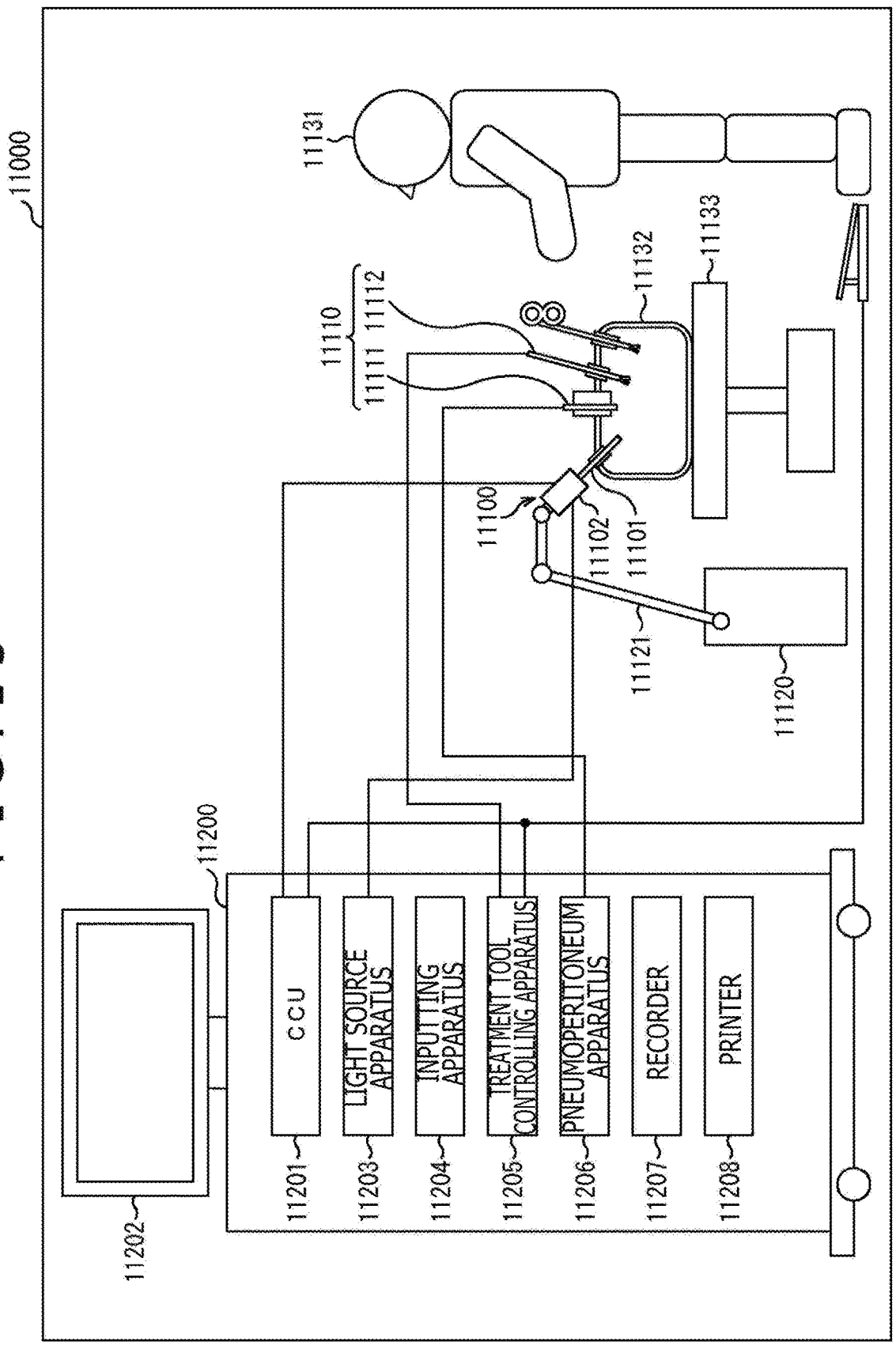
FIG. 15 is a view depicting an example of a schematic configuration of an endoscopic surgery system.

FIG. 15 is a view depicting an example of a schematic configuration of an endoscopic surgery system to which the technology according to an embodiment of the present disclosure (present technology) can be applied.

In FIG. 15, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 16:
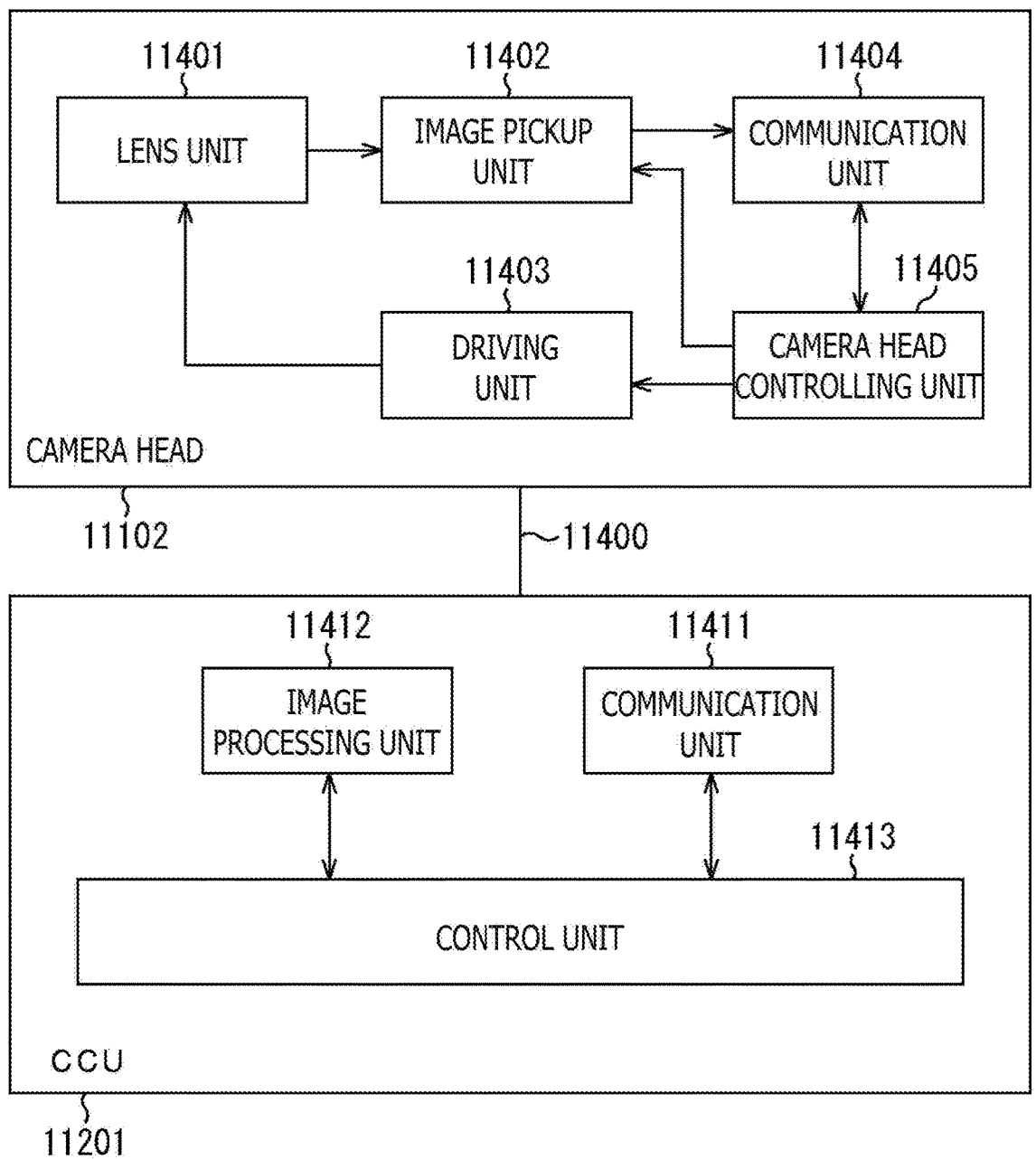
FIG. 16 is a block diagram depicting an example of a functional configuration of a camera head and a CCU.

FIG. 16 is a block diagram depicting an example of a functional configuration of the camera head 11102 and the CCU 11201 depicted in FIG. 15.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscope surgery system to which the technology according to the present disclosure can be applied has been described. The technology according to the present disclosure can be applied to the image pickup unit 11402 of the camera head 11102 from within the configuration described above. In particular, the solid-state image pickup device 1 to which any embodiment described hereinabove is applied can be applied to the image pickup unit 10402. By applying the technology according to the present disclosure to the image pickup unit 10402, it is possible to suppress picture quality degradation of an operative part image obtained by the image pickup unit 10402 and implement improvement of the S/N ratio and a high dynamic range, and consequently, a clearer operative part image can be obtained and the operator can confirm the operative part with certainty.

It is to be noted that, while an endoscope surgical system is described as an example here, the technology according to the present disclosure may be applied to other systems, for example, to a microscopic surgical system and so forth.

11. Application Example to Mobile Body

The technology according to the present disclosure (present technology) can be applied to various products. For example, the technology according to the present disclosure may be implemented as an apparatus incorporated in a mobile body of any type from among an automobile, an electric car, a hybrid electric car, a motorcycle, a bicycle, a personal mobility, an airplane, a drone, a ship, a robot or the like.

Figure 17:
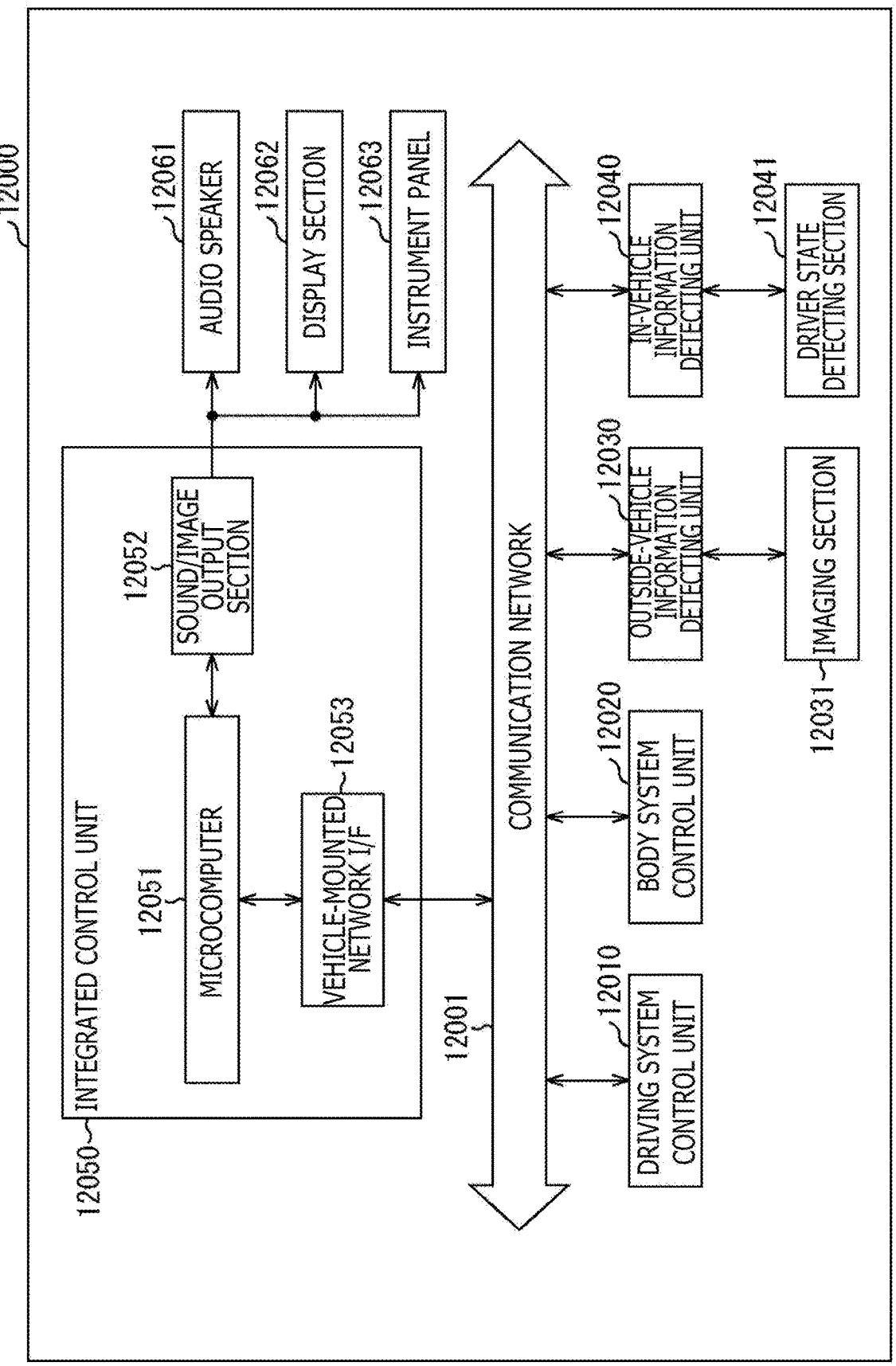
FIG. 17 is a block diagram depicting an example of a schematic configuration of a vehicle controlling system.

FIG. 17 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 17, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 17, an audio speaker 12061, a display section 12062, and an instrument panel 12063 are illustrated as the output device. The display section 12062 may, for example, include at least one of an on-board display and a head-up display.

Figure 18:
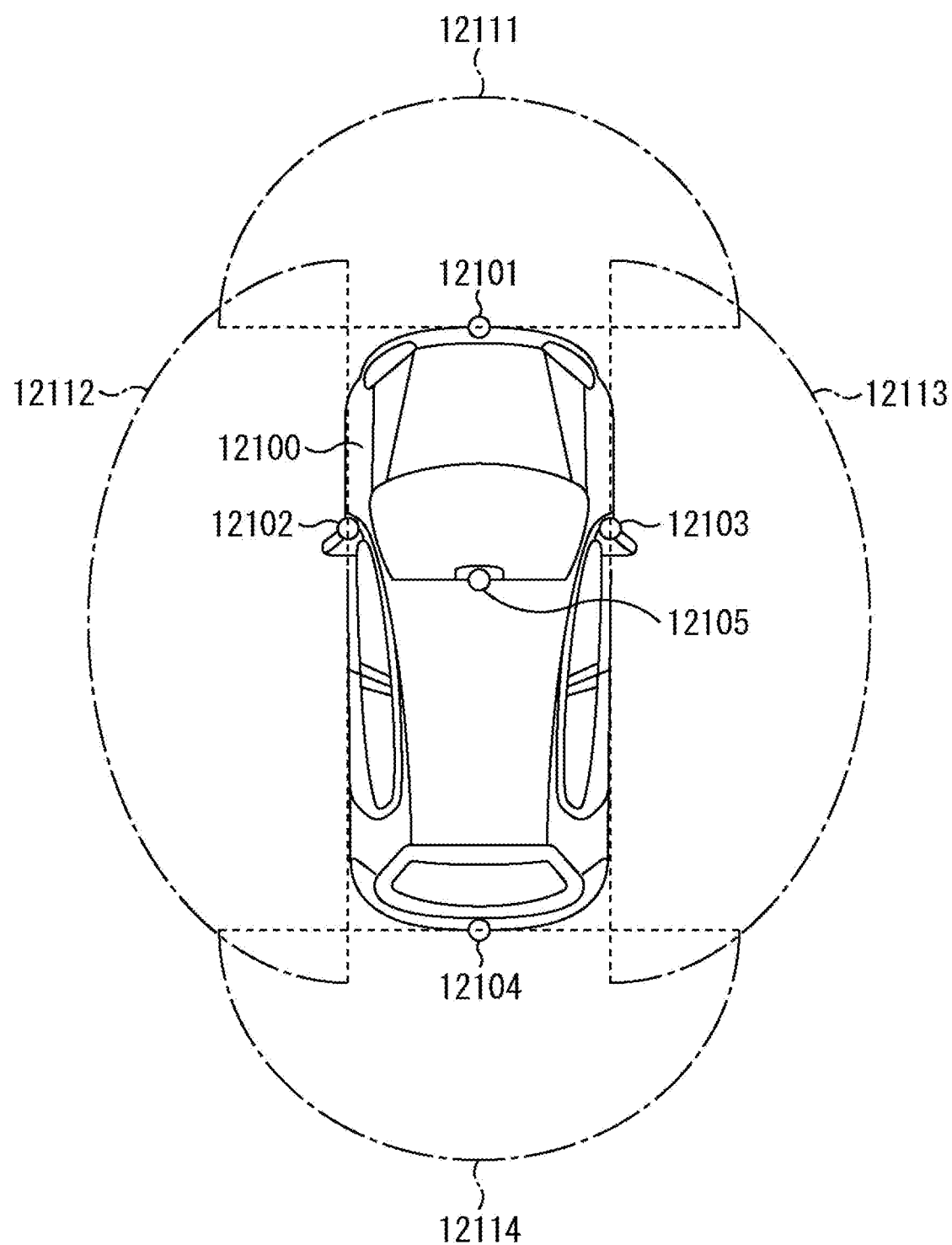
FIG. 18 is an explanatory view of an example of installation positions of an outside-vehicle information detecting unit and an image pickup unit.

FIG. 18 is a diagram depicting an example of the installation position of the imaging section 12031.

In FIG. 18, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 18 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure can be applied has been described. The technology according to the present disclosure can be applied to the image pickup unit 12031 from within the configuration described hereinabove. In particular, the solid-state image pickup device 1 to which any embodiment described hereinabove is applied can be applied to the image pickup unit 12031. By applying the technology according to the present disclosure to the image pickup unit 12031, a picked up image that is easy to view can be obtained, and therefore, it is possible to reduce the fatigue of the driver or increase the degree of safety of the driver or the vehicle.

While the example described above is directed to a case in which charge (signal charge) treated as a signal in the photoelectric conversion unit 21 is pores, the present technology can be applied also to an alternative solid-state image pickup device in which electrons are signal charge. In this case, each conduction type of the semiconductor substrate 12, semiconductor thin film 41 and so forth is made a reverse conduction type, or the bias voltage to be applied is reversed in polarity.

Further, the present technology can be applied not only to a solid-state image pickup device that detects a distribution of an incident light amount of visible rays and picks up an image of the detected distribution but also to a solid-state image pickup device (physical amount distribution detection apparatus) in general such as a solid-state image pickup device that picks up an image of a distribution of the incident amount of infrared rays, X rays, particles or the like, a fingerprint detection sensor that detects, as a meaning in a broad sense, a distribution of a different physical amount such as a pressure, a capacitance or the like and picks up an image of the distribution, and so forth.

Further, the present technology can be applied not only to a solid-state image pickup device but also to a semiconductor device in general having a different semiconductor integrated circuit.

The embodiment of the present technology is not limited to the embodiments described above but can be altered in various manners without departing from the subject matter of the present technology.

For example, a form that includes a combination of all or some of the plurality of embodiments described hereinabove can be adopted.

It is to be noted that the advantageous effects described in the present specification are exemplary to the last and shall not be restrictive, and other effects may be available.

It is to be noted that also it is possible for the present technology to assume such configurations as described below.

(A1)

A solid-state image pickup device, including:
a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, in which
the pixel array region has a voltage application pixel on an outermost circumference of the pixel array region or on the outer side with respect to an effective pixel region of the pixel array region, the voltage application pixel being one of the pixels to which a fixed voltage is normally applied.

(A2)

The solid-state image pickup device according to (A1) above, in which
in the voltage application pixel, a reset transistor of the pixel is normally controlled to an on state such that the fixed voltage is normally applied.

(A3)

The solid-state image pickup device according to (A1) above, in which
in the voltage application pixel, an electrode portion for extracting charge generated in the photoelectric conversion unit is connected to the ground without the intervention of a pixel transistor such that the fixed voltage is normally applied.

(A4)

The solid-state image pickup device according to (A3) above, in which
the fixed voltage applied to the voltage application pixel is higher than a voltage applied to an ordinary pixel of the pixel array region.

(A5)

The solid-state image pickup device according to any one of (A1) to (A4) above, in which the voltage application pixel is disposed in one row and one column of the outermost circumference of the pixel array region.

(A6)

The solid-state image pickup device according to any one of (A1) to (A4) above, in which
the voltage application pixel is disposed in a plurality of rows and a plurality of columns of the outermost circumference of the pixel array region.

(A7)

A controlling method for a solid-state image pickup device, in which the solid-state image pickup device that includes a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns
normally applies a fixed voltage to one of the pixels, which is on an outermost circumference of the pixel array region or on the outer side with respect to an effective pixel region of the pixel array region.

(A8)

An electronic apparatus, including:
a solid-state image pickup device including
a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, in which
the solid-stage image pickup device has a voltage application pixel on an outermost circumference of the pixel array region or on the outer side with respect to an effective pixel region of the pixel array region, the voltage application pixel being one of the pixels to which a fixed voltage is normally applied.

(B1)

A solid-state image pickup device, including:
a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, in which
the pixel array region has a voltage application pixel between an effective pixel and an OPB pixel of the pixel array region, the voltage application pixel being one of the pixels to which a fixed voltage is normally applied.

(B2)

The solid-state image pickup device according to (B1) above, in which
in the voltage application pixel, a reset transistor of the pixel is normally controlled to an on state such that the fixed voltage is normally applied.

(B3)

The solid-state image pickup device according to (B1) above, in which
in the voltage application pixel, an electrode portion for extracting charge generated in the photoelectric conversion unit is connected to the ground without the intervention of a pixel transistor such that the fixed voltage is normally applied.

(B4)

The solid-state image pickup device according to (B3) above, in which
the fixed voltage applied to the voltage application pixel is higher than a voltage applied to an ordinary pixel of the pixel array region.

(B5)

The solid-state image pickup device according to any one of (B1) to (B4) above, in which
the voltage application pixel has a light shielding film on the upper side of the photoelectric conversion unit.

(B6)

The solid-state image pickup device according to any one of (B1) to (B5) above, in which
the voltage application pixel is disposed in one row and one column on the innermost side of an OPB region of the pixel array region.

(B7)

The solid-state image pickup device according to any one of (B1) to (B5) above, in which the voltage application pixel is disposed in a plurality of rows and a plurality of columns of an OPB region of the pixel array region.

(B8)

The solid-state image pickup device according to any one of (B1) to (B5) above, in which the voltage application pixel is disposed in one row and one column on an outermost circumference of an effective pixel region of the pixel array region and a plurality of rows and a plurality of columns including one row and one column on the innermost side of an OPB region.

(B9)

A controlling method for a solid-state image pickup device, in which the solid-state image pickup device including a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns normally applies a fixed voltage to one of the pixels, which is between an effective pixel and an OPB pixel of the pixel array region.

(B10)

An electronic apparatus, including:

a solid-state image pickup device including a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, in which the pixel array region has a voltage application pixel between an effective pixel and an OPB pixel of the pixel array region, the voltage application pixel being one of the pixels to which a fixed voltage is normally applied.

(C1)

A solid-state image pickup device, including:

a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, in which a PN junction portion is not disposed on a processed portion end face of the photoelectric conversion unit, which is an outermost circumference of the pixel array region.

(C2)

An electronic apparatus, including:

a solid-state image pickup device including a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns, in which a PN junction portion is not disposed on a processed portion end face of the photoelectric conversion unit, which is an outermost circumference of the pixel array region.

(D1)

A solid-state image pickup device, including:

a protective film configured to cover a processed portion end face of a photoelectric conversion unit, which is an outermost circumference of a pixel array region in which pixels are disposed two-dimensionally in rows and columns, each of the pixels including the photoelectric conversion unit that has one of a chemical semiconductor, amorphous silicon, germanium, a quantum dot photoelectric conversion film and an organic photoelectric conversion film.

(D2)

The solid-state image pickup device according to (D1) above, in which the photoelectric conversion unit is an N-type semiconductor thin film; and the protective film is a fixed charge film having positive fixed charge.

(D3)

The solid-state image pickup device according to (D1) or (D2) above, in which charge of the photoelectric conversion unit to be treated as a signal is pores; and the protective film is a fixed charge film having positive fixed charge.

(D4)

The solid-state image pickup device according to (D3) above, in which the photoelectric conversion unit is a P-type semiconductor thin film; and the protective film is a fixed charge film having negative fixed charge.

(D5)

The solid-state image pickup device according to (D1) or (D4) above, in which charge of the photoelectric conversion unit to be treated as a signal is electrons; and the protective film is a fixed charge film having negative fixed charge.

(D6)

An electronic apparatus, including:

a solid-state image pickup device including a protective film configured to cover a processed portion end face of a photoelectric conversion unit, which is an outermost circumference of a pixel array region in which pixels are disposed two-dimensionally in rows and columns, each of the pixels including the photoelectric conversion unit that has one of a chemical semiconductor, amorphous silicon, germanium, a quantum dot photoelectric conversion film and an organic photoelectric conversion film.

(E1)

A solid-state image pickup device, including:

an insulating film and a metal film that provide a MIS structure to a processed portion end face of a photoelectric conversion unit, which is an outermost circumference of a pixel array region in which pixels are disposed two-dimensionally in rows and columns, each of the pixels including the photoelectric conversion unit that has one of a chemical semiconductor, amorphous silicon, germanium, a quantum dot photoelectric conversion film and an organic photoelectric conversion film.

(E2)

The solid-state image pickup device according to (E1) above, in which the photoelectric conversion unit is an N-type semiconductor thin film; and a positive bias voltage is applied to the metal film.

(E3)

The solid-state image pickup device according to (E1) or (E2) above, in which charge of the photoelectric conversion unit to be treated as a signal is pores; and a positive bias voltage is applied to the metal film.

(E4)

The solid-state image pickup device according to (E3) above, in which the photoelectric conversion unit is a P-type semiconductor thin film; and a negative bias voltage is applied to the metal film.

(E5)

The solid-state image pickup device according to (E1) or (E4) above, in which charge of the photoelectric conversion unit to be treated as a signal is electrons; and a negative bias voltage is applied to the metal film.

(E6)

An electronic apparatus, including:

a solid-state image pickup device including an insulating film and a metal film that provide a MIS structure to a processed portion end face of a photoelectric conversion unit, which is an outermost circumference of a pixel array region in which pixels are disposed two-dimensionally in rows and columns, each of the pixels including the photoelectric conversion unit that has one of a chemical semiconductor, amorphous silicon, germanium, a quantum dot photoelectric conversion film and an organic photoelectric conversion film.

(F1)

A solid-state image pickup device, including:

a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns; and a voltage controlling unit configured to vary a voltage to be applied to the photoelectric conversion unit of the pixels in response to a surrounding environment.

(F2)

The solid-state image pickup device according to (F1) above, in which the voltage controlling unit varies the voltage to be applied to the photoelectric conversion unit in response to a pixel output of an effective pixel.

(F3)

The solid-state image pickup device according to (F1) or (F2) above, in which the voltage controlling unit varies the voltage to be applied to the photoelectric conversion unit in response to a pixel output of an OPB pixel.

(F4)

The solid-state image pickup device according to any one of (F1) to (F3) above, in which the voltage controlling unit varies the voltage to be applied to the photoelectric conversion unit simultaneously with regard to all pixels.

(F5)

The solid-state image pickup device according to any one of (F1) to (F3) above, in which the voltage controlling unit varies the voltage to be applied to the photoelectric conversion unit for each of a plurality of areas into which the pixel array region is divided.

(F6)

The solid-state image pickup device according to any one of (F1) to (F3) above, in which the voltage controlling unit varies the voltage to be applied to the photoelectric conversion unit for each pixel of the pixel array region.

(F7)

The solid-state image pickup device according to any one of (F1) to (F6) above, in which the photoelectric conversion unit includes a barrier layer that prevents backflow of charge.

(F8)

A controlling method for a solid-state image pickup device, in which the solid-state image pickup device including a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns varies a voltage to be applied to the photoelectric conversion unit of the pixels in response to a surrounding environment.

(F9)

An electronic apparatus, including:

a solid-state image pickup device including a pixel array region in which pixels each including a photoelectric conversion unit having one of a chemical semiconductor, amorphous silicon, germanium, a quantum dot photoelectric conversion film and an organic photoelectric conversion film are disposed two-dimensionally in rows and columns; and a voltage controlling unit configured to vary a voltage to be applied to the photoelectric conversion unit of the pixels in response to a surrounding environment.

(G1)

A solid-state image pickup device, including:

a pixel array region in which pixels are disposed two-dimensionally in rows and columns;

each of the pixels including a photoelectric conversion unit having one of a chemical semiconductor, amorphous silicon, germanium, a quantum dot photoelectric conversion film and an organic photoelectric conversion film, a plurality of capacitive elements each of which accumulates charge generated by the photoelectric conversion unit, and a changeover controlling unit that changes over a parallel connection of the plurality of capacitive elements between on and off in response to a surrounding environment.

(G2)

The solid-state image pickup device according to (G1) above, in which the parallel connection of the plurality of capacitive elements is changed over between on and off in response to a pixel output of an effective pixel.

(G3)

The solid-state image pickup device according to (G1) or (G2) above, in which the parallel connection of the plurality of capacitive elements is changed over between on and off in response to a pixel output of an OPB pixel.

(G4)

The solid-state image pickup device according to any one of (G1) to (G3) above, in which the parallel connection of the plurality of capacitive elements is changed over between on and off simultaneously with regard to all pixels.

(G5)

The solid-state image pickup device according to any one of (G1) to (G3) above, in which the parallel connection of the plurality of capacitive elements is changed over between on and off for each of a plurality of areas into which the pixel array region is divided.

(G6)

The solid-state image pickup device according to any one of (G1) to (G3) above, in which the parallel connection of the plurality of capacitive elements is changed over between on and off for each of the pixels of the pixel array region.

(G7)

The solid-state image pickup device according to any one of (G1) to (G6) above, in which the capacitive elements at least include a PN junction capacitor, a MOS capacitor and a wiring line capacitor.

(G8)

The solid-state image pickup device according to any one of (G1) to (G7) above, further including:

a voltage controlling unit configured to vary the voltage to be applied to the photoelectric conversion unit of the pixels in response to the surrounding environment.

(G9)

A controlling method for a solid-state image pickup device that includes:

a pixel array region in which pixels are disposed two-dimensionally in rows and columns;

each of the pixels including a photoelectric conversion unit having one of a chemical semiconductor, amorphous silicon, germanium, a quantum dot photoelectric conversion film and an organic photoelectric conversion film, a plurality of capacitive elements each of which accumulates charge generated by the photoelectric conversion unit, and a changeover controlling unit that changes over a parallel connection of the plurality of capacitive elements between on and off in response to a surrounding environment, in which the change-over controlling unit changes over the parallel connection of the plurality of capacitive elements between on and off in response to a surrounding environment.

(G10)

An electronic apparatus, including:

a solid-state image pickup device including a pixel array region in which pixels are disposed two-dimensionally in rows and columns;

each of the pixels including a photoelectric conversion unit having one of a chemical semiconductor, amorphous silicon, germanium, a quantum dot photoelectric conversion film and an organic photoelectric conversion film, a plurality of capacitive elements each of which accumulates charge generated by the photoelectric conversion unit, and a changeover controlling unit that changes over a parallel connection of the plurality of capacitive elements between on and off in response to a surrounding environment.

REFERENCE SIGNS LIST

1 Solid-state image pickup device, 2 Pixel, 2A Ordinary pixel, 2B Charge emitting pixel, 2Ca Black level reading out OPB pixel, 2Cb Charge emitting OPB pixel, 2C OPB pixel, 3 Pixel array region, 4 Vertical driving circuit, 12 Semiconductor substrate, 21 Photoelectric conversion unit, 22 (22A, 22B) Capacitive element, 23 Reset transistor, 53A, 53B Connection electrode, 54 Bump electrode, 81 Charge emitting region, 101 OPB region, 102 Effective pixel region, 111 Light shielding film, 201 Fixed charge film, 221 Insulating film, 222 Metal film, 241 Changeover controlling transistor, 242 Voltage controlling unit, 300 Image pickup apparatus, 302 Solid-state image pickup device

What is claimed is:

1. A solid-state image pickup device, comprising:

a protective film configured to cover a processed portion end face of a photoelectric conversion unit, which is an outermost circumference of a pixel array region in which pixels are disposed two-dimensionally in rows and columns, each of the pixels including the photoelectric conversion unit that has one of a chemical semiconductor, amorphous silicon, germanium, a quantum dot photoelectric conversion film and an organic photoelectric conversion film, wherein the photoelectric conversion unit is an N-type semiconductor thin film; and wherein the protective film is a fixed charge film having a positive fixed charge.

2. The solid-state image pickup device according to claim 1, wherein a material for the protective film includes silicon oxide, silicon nitride, aluminum oxide or hafnium oxide.

3. The solid-state image pickup device according to claim 1, wherein the protective film suppresses dark currents from the processed portion end face of the photoelectric conversion unit.

4. The solid-state image pickup device according to claim 1, further comprising a color filter and an on-chip lens for each of the pixels.

5. The solid-state image pickup device according to claim 1, wherein a PN junction is not disposed on the processed portion end face of the photoelectric conversion unit.

6. A solid-state image pickup device, comprising:

a protective film configured to cover a processed portion end face of a photoelectric conversion unit, which is an outermost circumference of a pixel array region in which pixels are disposed two-dimensionally in rows and columns, each of the pixels including the photoelectric conversion unit that has one of a chemical semiconductor, amorphous silicon, germanium, a quantum dot photoelectric conversion film and an organic photoelectric conversion film, wherein signal charges of the photoelectric conversion unit are pores; and wherein the protective film is a fixed charge film having a positive fixed charge.

7. The solid-state image pickup device according to claim 6, wherein a material for the protective film includes silicon oxide, silicon nitride, aluminum oxide or hafnium oxide.

8. The solid-state image pickup device according to claim 6, wherein the protective film suppresses dark currents from the processed portion end face of the photoelectric conversion unit.

9. The solid-state image pickup device according to claim 6, further comprising a color filter and an on-chip lens for each of the pixels.

10. The solid-state image pickup device according to claim 6, wherein a PN junction is not disposed on the processed portion end face of the photoelectric conversion unit.

11. A solid-state image pickup device, comprising:
a protective film configured to cover a processed portion end face of a photoelectric conversion unit, which is an outermost circumference of a pixel array region in which pixels are disposed two-dimensionally in rows and columns,
each of the pixels including the photoelectric conversion unit that has one of a chemical semiconductor, amorphous silicon, germanium, a quantum dot photoelectric conversion film and an organic photoelectric conversion film,
wherein the photoelectric conversion unit is a P-type semiconductor thin film; and
wherein the protective film is a fixed charge film having a negative fixed charge.

12. The solid-state image pickup device according to claim 11, wherein a material for the protective film includes silicon oxide, silicon nitride, aluminum oxide or hafnium oxide.

13. The solid-state image pickup device according to claim 11, wherein the protective film suppresses dark currents from the processed portion end face of the photoelectric conversion unit.

14. The solid-state image pickup device according to claim 11, further comprising a color filter and an on-chip lens for each of the pixels.

15. The solid-state image pickup device according to claim 11, wherein a PN junction is not disposed on the processed portion end face of the photoelectric conversion unit.

16. A solid-state image pickup device, comprising:
a protective film configured to cover a processed portion end face of a photoelectric conversion unit, which is an outermost circumference of a pixel array region in which pixels are disposed two-dimensionally in rows and columns,
each of the pixels including the photoelectric conversion unit that has one of a chemical semiconductor, amorphous silicon, germanium, a quantum dot photoelectric conversion film and an organic photoelectric conversion film,
wherein signal charges of the photoelectric conversion unit are electrons; and
wherein the protective film is a fixed charge film having a negative fixed charge.

17. The solid-state image pickup device according to claim 16, wherein a material for the protective film includes silicon oxide, silicon nitride, aluminum oxide or hafnium oxide.

18. The solid-state image pickup device according to claim 16, wherein the protective film suppresses dark currents from the processed portion end face of the photoelectric conversion unit.

19. The solid-state image pickup device according to claim 16, further comprising a color filter and an on-chip lens for each of the pixels.

20. The solid-state image pickup device according to claim 16, wherein a PN junction is not disposed on the processed portion end face of the photoelectric conversion unit.

* * * * *